(12) United States Patent
Byun et al.

(10) Patent No.: US 12,239,000 B2
(45) Date of Patent: Feb. 25, 2025

(54) DISPLAY DEVICE AND METHOD OF MANUFACTURING THE SAME

(71) Applicant: SAMSUNG DISPLAY CO., LTD., Yongin-si (KR)

(72) Inventors: Jin Su Byun, Seoul (KR); Woong Sik Kim, Hwaseong-si (KR); Dong Hwan Bae, Seoul (KR); Sang Hyun Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 497 days.

(21) Appl. No.: 17/648,061

(22) Filed: Jan. 14, 2022

(65) Prior Publication Data

US 2022/0231090 A1 Jul. 21, 2022

(30) Foreign Application Priority Data

Jan. 18, 2021 (KR) ........................ 10-2021-0006899

(51) Int. Cl.
*H10K 59/40* (2023.01)
*G06F 3/041* (2006.01)
*G06F 3/044* (2006.01)
*H10K 71/00* (2023.01)
(Continued)

(52) U.S. Cl.
CPC ........... *H10K 59/40* (2023.02); *G06F 3/0412* (2013.01); *G06F 3/0445* (2019.05); *G06F 3/0446* (2019.05); *H10K 71/00* (2023.02); *G06F 2203/04103* (2013.01); *G06F 2203/04111* (2013.01); *H10K 59/1201* (2023.02); *H10K 59/131* (2023.02)

(58) Field of Classification Search
CPC ..... H10K 59/40; G06F 3/0445; G06F 3/0446; G06F 3/0412
See application file for complete search history.

(56) References Cited

U.S. PATENT DOCUMENTS 9,645,688 B2 5/2017 Yao et al.
2018/0232090 A1* 8/2018 Yoon ..................... G06F 3/0412

FOREIGN PATENT DOCUMENTS

| KR | 10-2008-0000749 | 1/2008 |
| KR | 10-2013-0118072 | 10/2013 |
| KR | 10-2018-0070218 | 6/2018 |

(Continued)

*Primary Examiner* — Peter M Albrecht
(74) *Attorney, Agent, or Firm* — F. CHAU & ASSOCIATES, LLC

(57) ABSTRACT

A display device includes a display member and a touch member disposed on the display member. The touch member includes a first touch insulating disposed on the display member, a first touch conductive layer disposed on the first touch insulating layer and including a touch bridge electrode, a second touch insulating layer disposed on the first touch conductive layer, including an organic material, and including a first contact hole penetrating the second touch insulating layer in a thickness direction, a second touch conductive layer disposed on the second touch insulating layer and including a first lower sensing line overlapping the second touch bridge electrode, and a third touch conductive layer disposed on the second touch conductive layer and including a first upper sensing line overlapping the first lower sensing line. A width of the first upper sensing line is greater than a width of the first lower sensing line.

14 Claims, 19 Drawing Sheets

(51) Int. Cl.
    *H10K 59/12* (2023.01)
    *H10K 59/131* (2023.01)

(56) References Cited

FOREIGN PATENT DOCUMENTS

KR    10-2018-0094596    8/2018
KR    10-2020-0071189    6/2020

* cited by examiner

YMTL1: CP2
YMTL2: SPL1a, SPL2a, PE3
YMTL3: SPL1b, SPL2b, PE4

YMTL2: SPL1a, SPL2a, PE3
YMTL3: SPL1b, SPL2b, PE4

YMTL2: SPL1a, SPL2a, PE3
YMTL3: SPL1b, SPL2b, PE4

YMTL2: SPL1a, SPL2a, PE3

YMTL2_1: SPL1a_1, SPL2a_1, PE3_1
YMTL3_1: SPL1b_1, SPL2b_1, PE4_1

DISPLAY DEVICE AND METHOD OF MANUFACTURING THE SAME

This application claims priority under 35 U.S.C. § 119 to Korean Patent Application No. 10-2021-0006899, filed on Jan. 18, 2021, in the Korean Intellectual Property Office, the disclosure of which is incorporated by reference herein in its entirety.

BACKGROUND

1. Field

The present disclosure relates to a display device and a method of manufacturing the same.

2. Description of the Related Art

Electronic devices that provide images to a user, such as smartphones, tablet personal computers (PCs), digital cameras, notebook computers, navigation systems and smart televisions, include a display device for displaying images. The display device includes a display member that generates and displays an image and various input devices.

The display device includes a touch member disposed on the display member. The touch member may include a plurality of touch conductive layers and a plurality of touch insulating layers insulating the touch conductive layers.

The touch conductive layers may form parasitic capacitance with display conductive layers of the display member, which may reduce the touch sensitivity of the touch member.

SUMMARY

Aspects of the present disclosure provide a display device having improved touch characteristics of a touch member and improved defects of a second touch insulating layer of the touch member.

Aspects of the present disclosure also provide a method of manufacturing a display device having improved touch characteristics of a touch member and improved defects of a second touch insulating layer of the touch member.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment of the present disclosure, a display device includes a display member, and a touch member which is disposed on the display member. The touch member comprises: a first touch insulating layer which is disposed on the display member, a first touch conductive layer which is disposed on the first touch insulating layer and comprises a touch bridge electrode, a second touch insulating layer which is disposed on the first touch conductive layer, comprises an organic material, and comprises a first contact hole penetrating the second touch insulating layer in a thickness direction, a second touch conductive layer which is disposed on the second touch insulating layer and comprises a first lower sensing line overlapping the second touch bridge electrode, and a third touch conductive layer which is disposed on the second touch conductive layer and comprises a first upper sensing line overlapping the first lower sensing line, wherein a width of the first upper sensing line is greater than a width of the first lower sensing line.

According to an embodiment of the present disclosure, a method of manufacturing a display device comprises forming a display member by forming a first insulating layer on a substrate part which comprises an active area and a non-active area located around the active area and comprising a pad area, forming a first conductive layer which is disposed on the first insulating layer and comprises a gate electrode of the active area and a first pad electrode of the pad area, forming a second insulating layer which is disposed on the first conductive layer, and forming a second conductive layer which is disposed on the second insulating layer and comprises a drain electrode and a source electrode of the active area and a second pad electrode of the pad area, forming a first touch insulating layer on the second conductive layer in the active area and the pad area, forming a first touch conductive layer, which comprises a touch bridge electrode, on the first touch insulating layer in the active area, forming a second touch insulating layer, which is made of an organic material, on the first touch conductive layer in the active area and the pad area, forming a first contact hole which exposes an upper surface of the second touch bridge electrode and forming a second contact hole which exposes an upper surface of the second pad electrode, forming a second touch conductive layer on the second touch insulating layer, forming a third touch conductive layer on the second touch conductive layer, forming a photoresist on the third touch conductive layer, forming a first upper sensing line and a second upper sensing line of the third touch conductive layer at a distance from each other in the active area and forming a fourth pad electrode of the third touch conductive layer in the pad area by using the photoresist, and performing an ashing operation to remove the photoresist by using an ashing solution.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
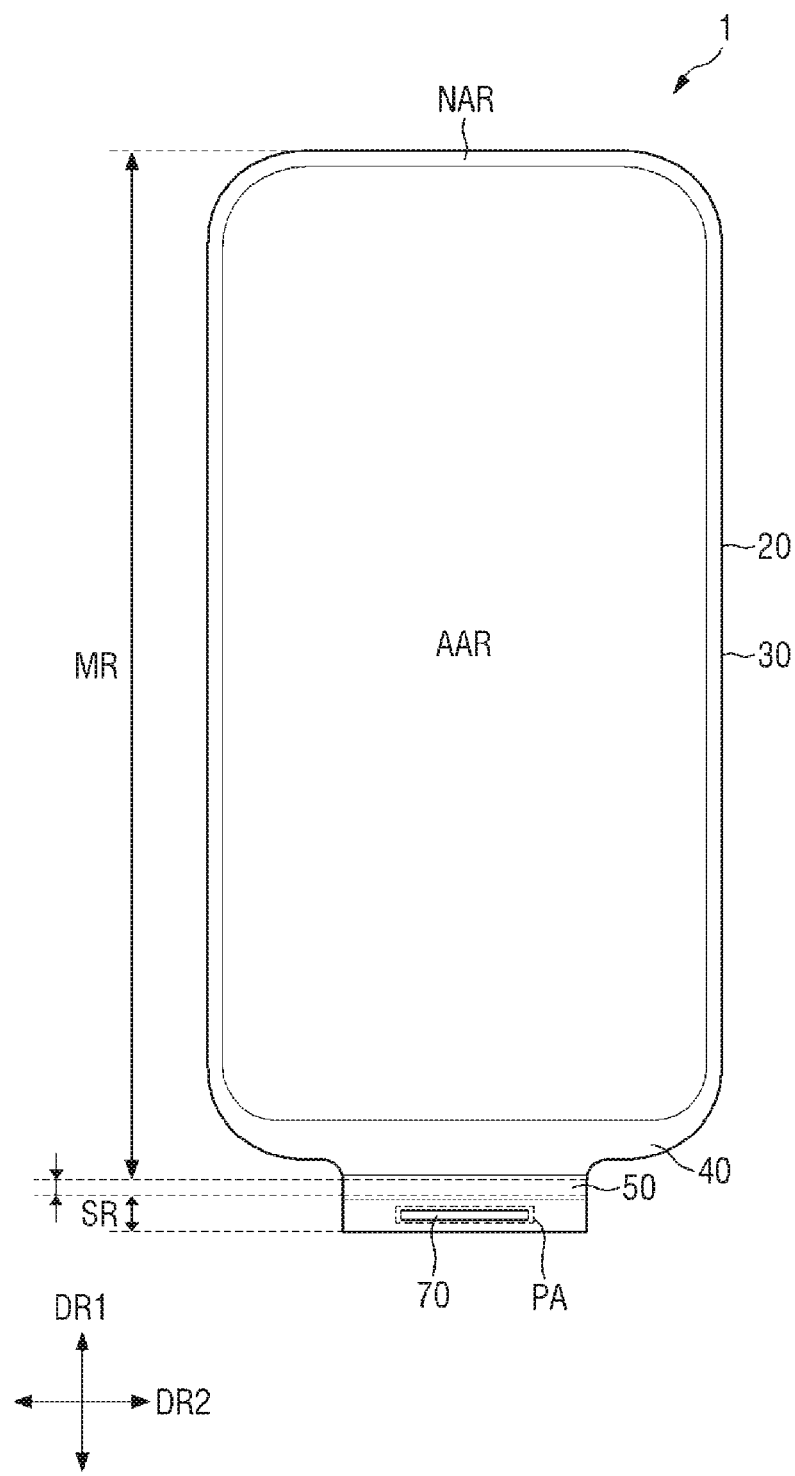
FIG. 1 is a plan layout view of a display device according to an embodiment of the present inventive concept.

Specific structural and functional descriptions of embodiments of the invention disclosed herein are only for illustrative purposes of the embodiments of the invention. The invention may be embodied in many different forms without departing from the spirit and significant characteristics of the invention. Therefore, the embodiments of the invention are disclosed only for illustrative purposes and should not be construed as limiting the invention.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

Figure 2:
FIG. 2 is a schematic cross-sectional view of the bent display device according to an embodiment of the present inventive concept.
Figure 3:
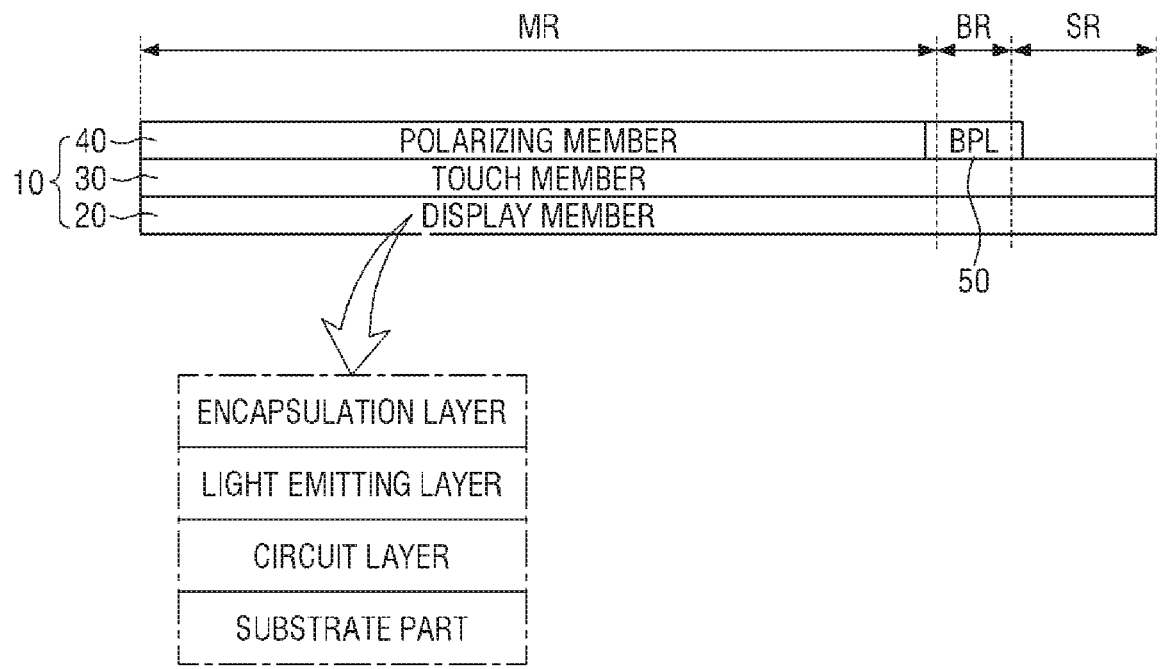
FIG. 3 is a schematic cross-sectional view of the display device according to an embodiment of the present inventive concept.

FIG. 1 is a plan layout view of a display device 1 according to an embodiment. FIG. 2 is a schematic partial cross-sectional view of the display device 1 according to an embodiment. FIG. 3 is a schematic cross-sectional view of the display device 1 according to an embodiment.

In embodiments, a first direction DR1 and a second direction DR2 extend in different directions and intersect each other. In the plan view of FIG. 1, the first direction DR1 which is a vertical direction and the second direction DR2 which is a horizontal direction are defined for ease of description. In the following embodiments, a side in the first direction DR1 refers to an upward direction in a plan view, the other side in the first direction DR1 refers to a downward direction in the plan view, a side in the second direction DR2 refers to a right direction in a plan view, and the other side in the second direction DR2 refers to a left direction in the plan view. However, directions mentioned in embodiments should be understood as relative directions, and the embodiments are not limited to the mentioned directions.

Referring to FIGS. 1 through 3, the display device 1 may refer to any electronic device that provides a display screen. Examples of the display device 1 may include portable electronic devices such as mobile phones, smartphones, tablet personal computers (PCs), electronic watches, smart watches, watch phones, mobile communication terminals, electronic notebooks, electronic books, portable multimedia players (PMPs), navigation devices, game machines and digital cameras as well as televisions, notebook computers, monitors, billboards and the Internet of things (IoT), all of which provide a display screen.

The display device 1 includes an active area AAR and a non-active area NAR. In the display device 1, a part which displays a screen (i.e., images) may be defined as a display area, a part which does not display a screen may be defined as a non-display area, and a part in which a touch input is sensed may be defined as a touch area. The display area and the touch area may be included in the active area AAR. The display area and the touch area may overlap. The active area AAR may be an area where a screen is displayed, and a touch input is sensed. The active area AAR may be shaped like a rectangle or a rectangle with rounded corners. The active area AAR illustrated in the drawings is shaped like a rectangle that has rounded corners and is longer in the first direction DR1 than in the second direction DR2. However, the shape of the active area AAR is not limited to this shape, and the active area AAR may have various shapes such as a rectangular shape that is longer in the second direction DR2 than in the first direction DR1, square or other polygonal shapes, a circular shape, and an elliptical shape.

The non-active area NAR is disposed around the active area AAR. The non-active area NAR may be a bezel area. The non-active area NAR may surround all sides (e.g., four sides in the drawings) of the active area AAR. However, the present disclosure is not limited thereto. For example, the non-active area NAR may not be disposed around an upper side of the active area AAR or around left and right sides of the active area AAR.

In the non-active area NAR, signal wirings or driving circuits for transmitting signals to the active area AAR (the display area or the touch area) may be disposed. The non-active area NAR may not include the display area. The non-active area NAR may not include the touch area. In an embodiment, the non-active area NAR may include a part of the touch area, and a sensor member such as a pressure sensor may be disposed in the part of the touch area. In some embodiments, the active area AAR may be exactly the same as the display area where a screen is displayed, and the non-active area NAR may be exactly the same as the non-display area where no screen is displayed.

The display device 1 includes a display panel 10 that provides a display screen. The display panel 10 may be, for example, an organic light emitting display panel, a micro light emitting diode (LED) display panel, a nano LED display panel, a quantum dot light emitting display panel, a liquid crystal display panel, a plasma display panel, a field emission display panel, an electrophoretic display panel, or an electrowetting display panel. A case where an organic light emitting display panel is applied as an example of the display panel 10 will be described below, but the present disclosure is not limited thereto, and other display panels may be applied as long as the same technical spirit is applicable.

The display device 1 may further include a touch member 30 which senses a touch input. The touch member 30 may be provided as a panel or film separate from the display panel 10 and attached onto the display panel 10. The present invention, however, is not limited thereto. For example, the touch member 30 may be provided in the form of a touch layer inside the display panel 10. In the following embodiments, a case where the touch member 30 is provided inside the display panel 10 and included in the display panel 10 will be described as an example, but the present disclosure is not limited thereto.

The display panel 10 may include a flexible substrate including or being formed of a flexible polymer material such as polyimide. Accordingly, the display panel 10 may be bent, curved, folded, or rolled.

The display panel 10 may include a bending area BR where the display panel 10 is bent. The display panel 10 may be divided into a main area MR located on a side of the bending area BR and a sub area SR located on the other side of the bending area BR. The non-active area NAR of the display device 1 may include the bending area BR. The non-active area NAR may be divided into an area above the bending area BR in the first direction DR1 of FIG. 1 and an area below the bending area BR in the first direction DR1 of FIG. 1. The area above the bending area BR may be located in the main area MR to be described later, and the area below the bending area BR may be located in the sub area SR to be described later.

The display area of the display panel 10 is disposed in the main area MR. The display area includes a plurality of pixels. In an embodiment, an edge part around the display area in the main area MR, the whole of the bending area BR, and the whole of the sub area SR may be the non-display area. However, the present disclosure is not limited thereto, and the bending area BR and/or the sub area SR may also include the display area.

The main area MR may have a shape similar to the planar shape of the display device 1. The main area MR may be a flat area located in one plane. However, the present disclosure is not limited thereto, and at least one of edges of the main area MR excluding an edge (side) connected to the bending area BR may be curved to form a curved surface or may be bent perpendicularly.

If at least one of the edges of the main area MR excluding the edge (side) connected to the bending area BR is curved or bent, the display area may be disposed at the curved or bent edge. However, the present disclosure is not limited thereto, and the curved or bent edge may be the non-display area where no screen is displayed or may include a combination of the display area and the non-display area.

The bending area BR is connected to a side of the main area MR in the first direction DR1. For example, the bending area BR may be connected to a lower short side of the main area MR. A width of the bending area BR may be smaller than a width (of the short side) of the main area MR. A connection part of the main area MR and the bending area BR may have an L-cut shape.

In the bending area BR, the display panel 10 may be bent with a curvature in the downward direction in a thickness direction (e.g., in a direction opposite to a display surface). The bending area BR may have a constant radius of curvature. However, the present disclosure is not limited thereto, and the bending area BR may have a different radius of curvature in each section. As the display panel 10 is bent in the bending area BR, a surface of the display panel 10 may be reversed. For example, a surface of the display panel 10 which faces upward may be changed to face outward laterally through the bending area BR and then to face downward.

The sub area SR extends from the bending area BR. The sub area SR may extend away from a region where bending is completed and may extend parallel to the main area MA. The sub area SA may overlap the main area MA in the thickness direction of the display panel 10. A width (in the second direction DR2) of the sub area SA may be, but is not necessarily, equal to the width of the bending area BD.

The sub area SR may include a pad area PA as illustrated in FIG. 1. A driving chip 70 may be disposed in the pad area PA of the sub area SR. The driving chip 70 may include an integrated circuit for driving the display panel 10. The integrated circuit may include an integrated circuit for a display and/or an integrated circuit for a touch unit. The integrated circuit for a display and the integrated circuit for a touch unit may be provided as separate chips or may be integrated into one chip.

Although not illustrated, the sub area SR of the display panel 10 may further include a second pad area located between the pad area PA and an end of the display panel 10 on the other side in the first direction DR1. A driving board made of a flexible printed circuit board or film may be connected to the second pad area.

Referring to FIG. 3, the display panel 10 may include a display member 20, the touch member 30, a polarizing member 40, and a bending protective layer 50. The display member 20 may be disposed over the main area MR, the bending area BR, and the sub area SR. As illustrated in the enlarged view of FIG. 3, the display member 20 includes a substrate part 101 (see FIG. 4), a circuit layer (see 'TR' in FIG. 4) disposed on the substrate part 101, a light emitting layer 122 (e.g., an organic light emitting layer; see FIG. 4) disposed on the circuit layer, and an encapsulation layer 116 (see FIG. 4) disposed on the light emitting layer 122. The display panel 10 may further include a first electrode 121 (see FIG. 4) disposed under the light emitting layer 122 and a second electrode 123 (see FIG. 4) disposed on the light emitting layer 122. The first electrode 121, the light emitting layer 122, and the second electrode 123 may constitute a light emitting element. The light emitting element may be disposed in each pixel.

The planar shape of the display member 20 may be substantially the same as the planar shape of the display panel 10 as described above. For example, the display member 20 may have substantially the same planar shape as the main area MR, the bending area BR and the sub area SR combined.

The touch member 30 may be disposed on the display member 20. The touch member 30 may be disposed over the main area MR, the bending area BR, and the sub area SR. The touch member 30 may be formed directly on the display member 20. As will be described later, the touch member 30 may include a first touch insulating layer, a first touch conductive layer disposed on the first touch insulating layer, a second touch insulating layer disposed on the first touch conductive layer, a second touch conductive layer disposed on the second touch insulating layer, a third touch conductive layer disposed on the second touch conductive layer, and a third touch insulating layer disposed on the third touch conductive layer.

The planar shape of the touch member 30 may be substantially the same as the planar shape of the display member 20. For example, the touch member 30 may have substantially the same planar shape as the main area MR, the bending area BR and the sub area SR combined.

As illustrated in FIG. 3, the polarizing member 40 may overlap the main area MR in the thickness direction and may not be disposed in the bending area BR. The bending protective layer 50 may completely overlap the bending area BR and may extend to a part of the adjacent main area MR and a part of the adjacent sub area SR. Facing side surfaces of the polarizing member 40 and the bending protective layer 50 may contact each other. For example, no space exists between the facing side surfaces of the polarizing member 40 and the bending protective layer 50. A boundary between a side surface of the bending protective layer 50 and a side surface of the polarizing member 40 may be located in the main area MR.

Referring again to FIG. 1, the planar shape of the polarizing member 40 may be substantially the same as the planar shape of the touch member 30 corresponding to the main area MR. In some embodiments, the polarizing member 40 may be smaller than the touch member 30 in a plan view to expose a part of an edge of the touch member 30 corresponding to the main area MR.

The planar shape of the bending protective layer 50 may be substantially the same as the planar shape of the touch member 30 corresponding to the bending area BR. The planar shape of the bending protective layer 50 may be a substantially rectangular shape. In some embodiments, the bending protective layer 50 may be smaller than the touch member 30 in plan view. For example, a width of the bending protective layer 50 in the second direction DR2 may be smaller than a width of the touch member 30 in the second direction DR2.

Figure 4:
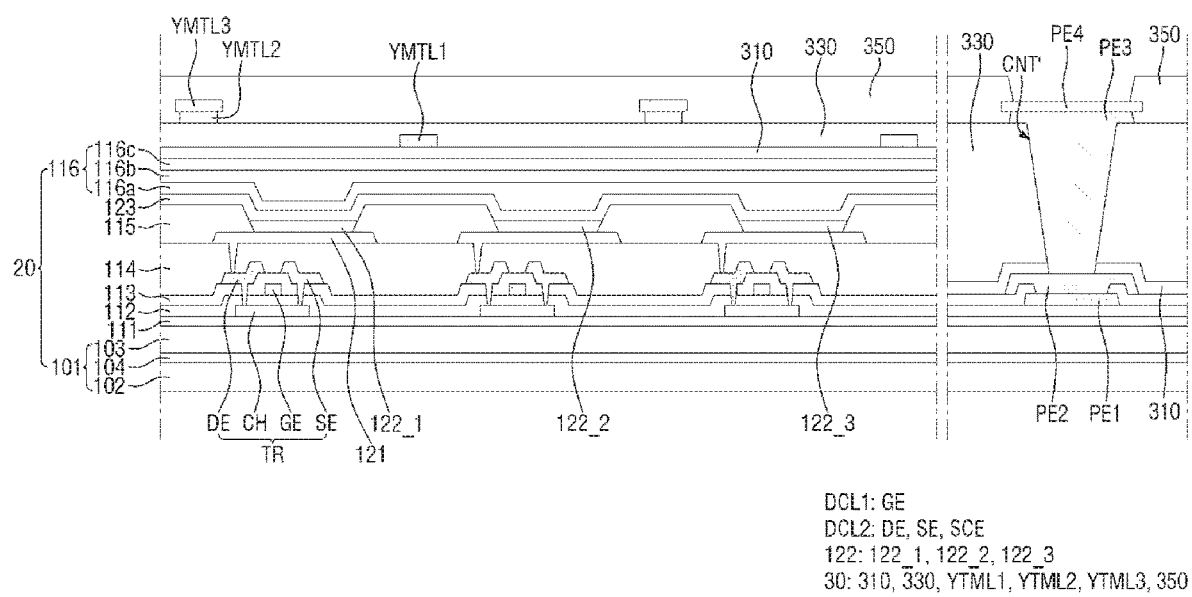
FIG. 4 is a cross-sectional view of a main area and a pad area of the display device according to an embodiment of the present inventive concept.
Figure 5:
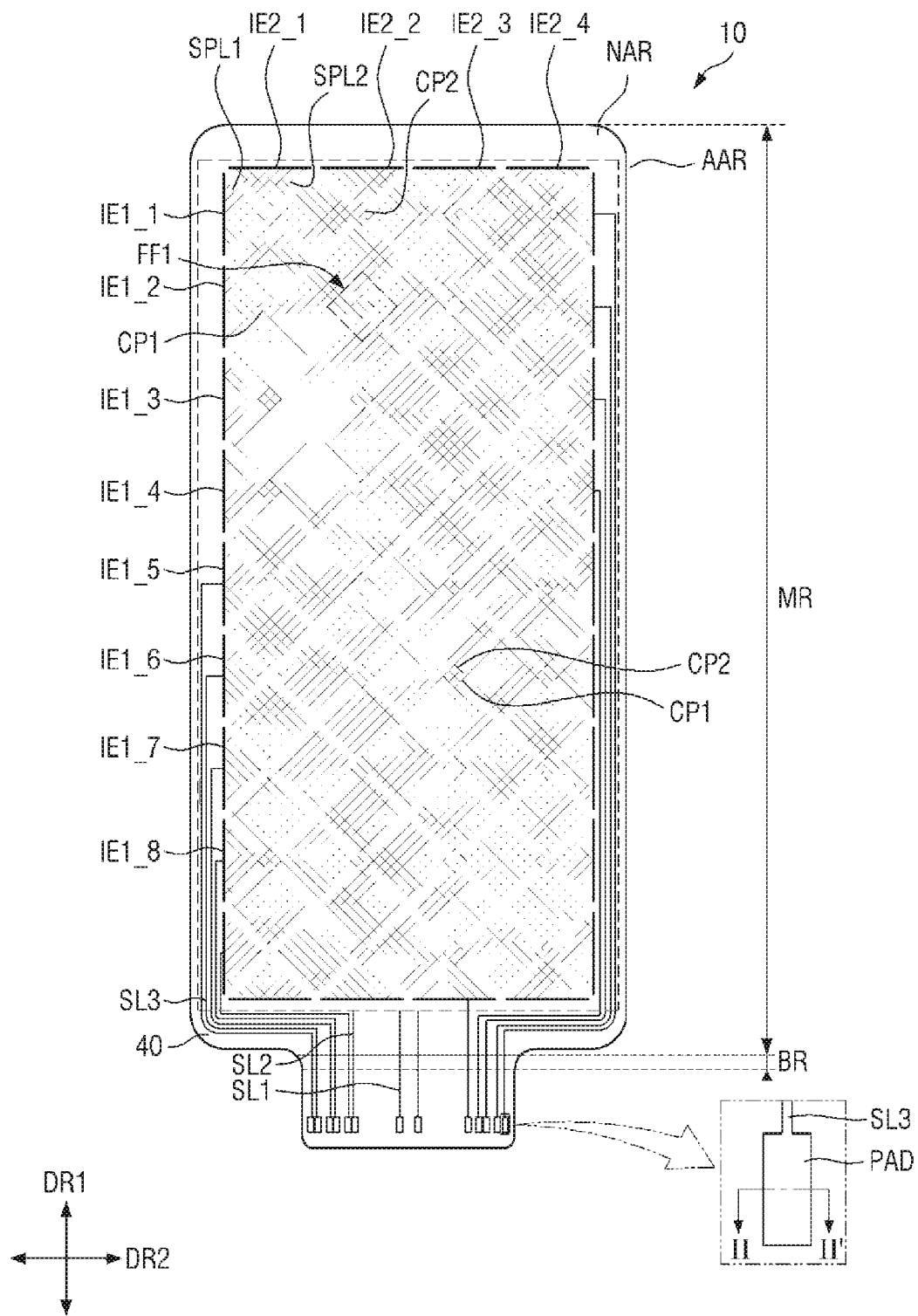
FIG. 5 is a plan layout view of a display member and a touch member of the display device according to an embodiment of the present inventive concept.
Figure 6:
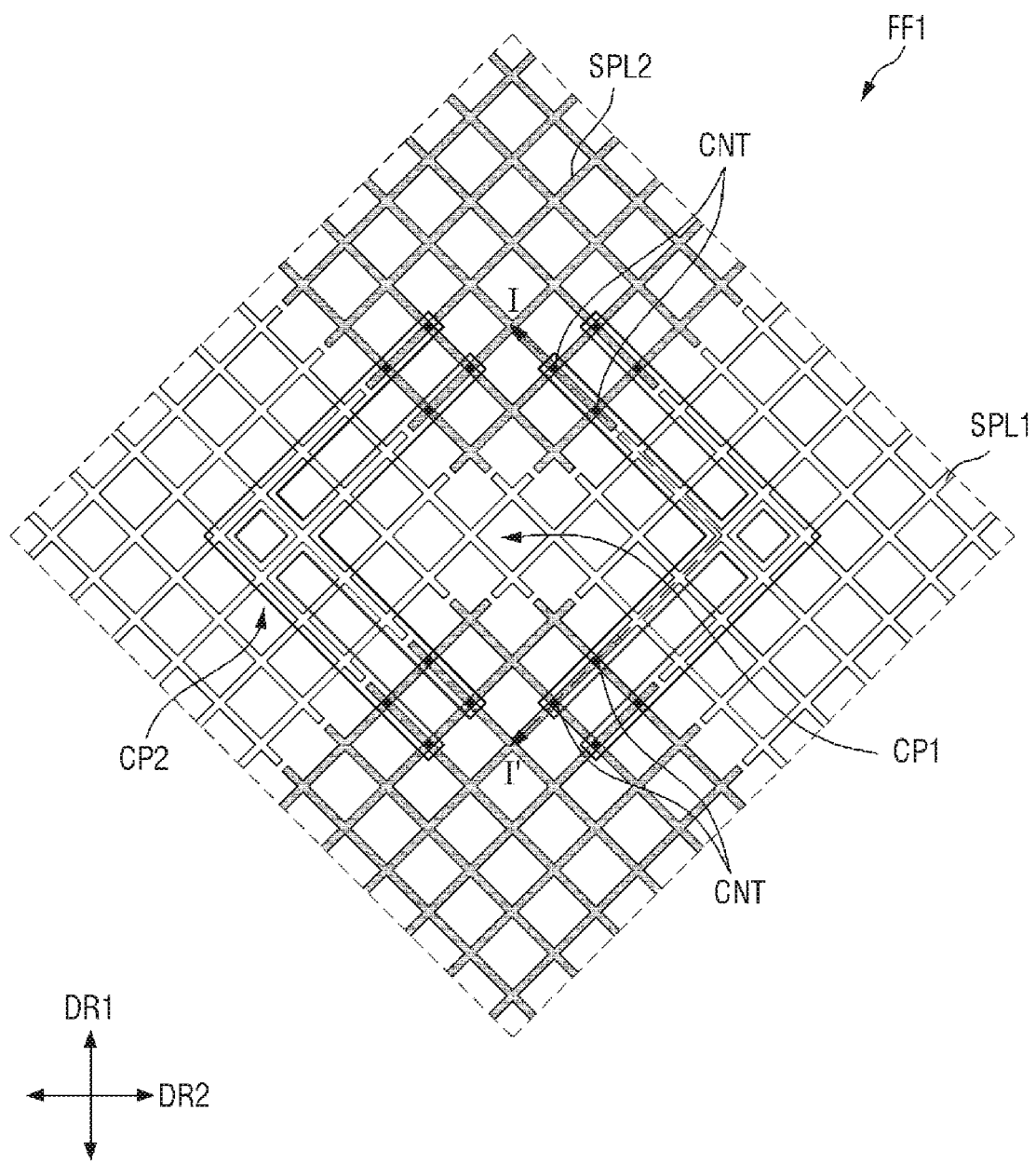
FIG. 6 is an enlarged plan view of area FF1 of FIG. 5 according to an embodiment of the present inventive concept.
Figure 7:
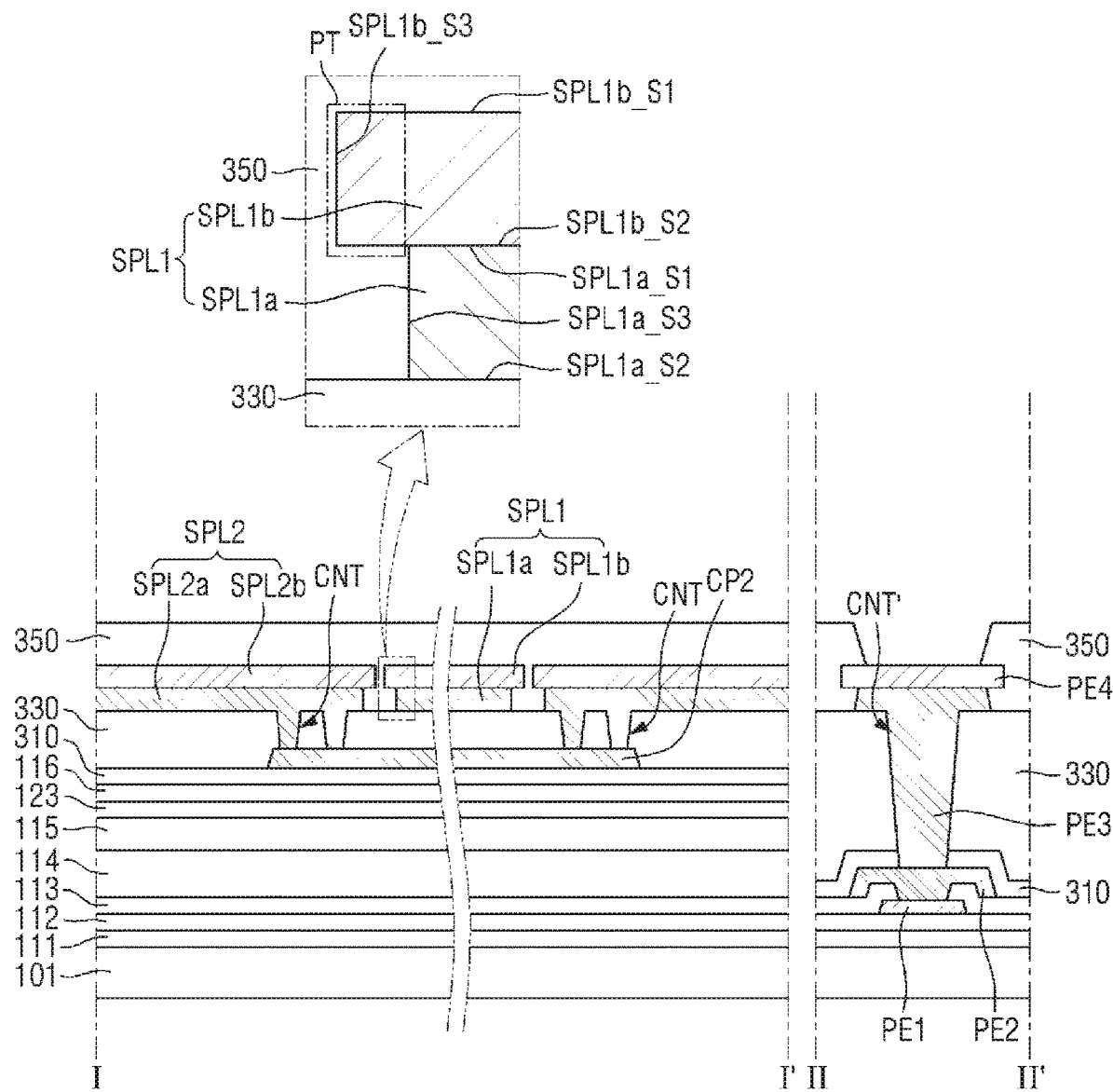
FIG. 7 is a cross-sectional view taken along line I-I' of FIG. 6 and along line II-II' of an enlarged view in FIG. 5 according to an embodiment of the present inventive concept.

FIG. 4 is a cross-sectional view of the main area MR and the pad area PA of the display device 1 according to an embodiment. FIG. 5 is a plan layout view of the display member 20 and the touch member 30 of the display device 1 according to an embodiment. FIG. 6 is an enlarged plan view of area FF1 of FIG. 5. FIG. 7 is a cross-sectional view taken along line I-I' of FIG. 6 and along line II-II' of an enlarged view in FIG. 5.

Referring to FIGS. 4 through 7, the substrate part 101 may include a first support substrate 102, a second support substrate 103 disposed on the first support substrate 102, and a barrier layer 104 disposed between the first support substrate 102 and the second support substrate 103. The first support substrate 102 and the second support substrate 103 may be flexible substrates as described above. For example, each of the first support substrate 102 and the second support substrate 103 may be one of a film substrate and a plastic substrate including a polymer organic material. For example, the first support substrate 102 and the second support substrate 103 may include one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate part 101 may include or may be formed of fiber glass reinforced plastic (FRP).

The barrier layer 104 may be disposed between the first support substrate 102 and the second support substrate 103 to bond the first support substrate 102 and the second support substrate 103 together while planarizing the first and second support substrates 102 and 103 including an organic material. The barrier layer 104 may include or may be formed of an inorganic material.

A buffer layer 111 is disposed on the substrate part 101. The buffer layer 111 may be disposed on the second support substrate 103. The buffer layer 111 functions to smooth a surface of the substrate part 101 and prevent penetration of moisture or outside air into the organic light emitting layer 122, for example. For example, the buffer layer 111 formed on the substrate part 101 may provide a planarized surface for the subsequent processes. The buffer layer 111 may be an inorganic layer. The buffer layer 111 may be a single layer or a multilayer.

A plurality of thin-film transistors TR are disposed on the buffer layer 111. The thin-film transistors TR may be driving thin-film transistors. One or more thin-film transistors TR may be provided in each pixel. Each of the thin-film transistors TR may include a semiconductor layer CH, a gate electrode GE, a source electrode SE, and a drain electrode DE.

More specifically, the semiconductor layer CH is disposed on the buffer layer 111. The semiconductor layer CH may include or may be formed of amorphous silicon, polysilicon, or an organic semiconductor. In an embodiment, the semiconductor layer CH may be an oxide semiconductor. Although not illustrated, the semiconductor layer CH may include a channel region, and a source region and a drain region disposed on opposite sides of the channel region and doped with impurities.

A gate insulating layer 112 is disposed on the semiconductor layer CH. The gate insulating layer 112 may be an inorganic layer. The gate insulating layer 112 may be a single layer or a multilayer.

A first conductive layer DCL1 may be disposed on the gate insulating layer 112. The first conductive layer DCL1 may include the gate electrode GE and a first pad electrode PE. The first conductive layer DCL1 may further include a plurality of scan lines. The gate electrode GE may be connected to one of the scan lines.

The first conductive layer DCL1 may be made of a metal material having conductivity. For example, the first conductive layer DCL1 may include or may be formed of molybdenum (Mo), aluminum (Al), copper (Cu), or titanium (Ti). The first conductive layer DCL1 may be a single layer or a multilayer.

An interlayer insulating film 113 is disposed on the first conductive layer DCL1. The interlayer insulating film 113 may be an inorganic layer. The interlayer insulating film 113 may be a single layer or a multilayer. The interlayer insulating film 113 may also be disposed in the pad area PA. In the pad area PA, the interlayer insulating film 113 may partially expose an upper surface of the first pad electrode PE1.

A second conductive layer DCL2 may be disposed on the interlayer insulating film 113. The second conductive layer DCL2 may include the source electrode SE, the drain electrode DE, and a second pad electrode PE2 disposed in the pad area PA. The second conductive layer DCL2 may include a high potential voltage wiring, a low potential voltage wiring, and a plurality of data lines, but the present disclosure is not limited thereto.

The source electrode SE and the drain electrode DE may be electrically connected to the source region and the drain region of the semiconductor layer CH respectively through contact holes penetrating the interlayer insulating film 113 and the gate insulating layer 112. The second pad electrode PE2 may be connected to the first pad electrode PE1. The second pad electrode PE2 may contact the upper surface of the first pad electrode PE1.

The second conductive layer DCL2 is made of a metal material having conductivity. For example, the second conductive layer DCL2 may include or may be formed of aluminum (Al), copper (Cu), titanium (Ti), or molybdenum (Mo).

Although not illustrated, the display device 1 may further include a storage capacitor and a switch thin-film transistor on the substrate part 101.

A protective layer 114 is disposed on the second conductive layer DCL2 and the interlayer insulating film 113. The protective layer 114 covers a pixel circuit part including the thin-film transistors TR. The protective layer 114 may be a planarization layer. The planarization layer may include or may be formed of a material such as acryl or polyimide.

A plurality of first electrodes 121 are disposed on the protective layer 114. A first electrode 121 may be a pixel electrode disposed in each pixel. The first electrode 121 may be an anode of an organic light emitting diode.

The first electrode 121 may be electrically connected to the drain electrode DE (or the source electrode SE) disposed on the substrate part 101 through a via hole penetrating the protective layer 114.

The first electrode 121 may include or may be formed of a material having a high work function. The first electrode 121 may include or may be formed of indium tin oxide (ITO), indium zinc oxide (IZO), zinc oxide (ZnO), indium oxide (In2O3), or the like. The above conductive materials have a relatively large work function and transparent properties. A top emission-type organic light emitting display device may include a reflective material such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture of the same, in addition to the above conductive materials. Therefore, the first electrode 121 may have a single layer structure composed of one of the conductive materials and reflective materials exemplified above or a multilayer structure in which the above materials are stacked on each other.

A pixel defining layer 115 is disposed on the first electrode 121. The pixel defining layer 115 includes an opening exposing at least a part of the first electrode 121. The pixel defining layer 115 may include or may be formed of an organic material or an inorganic material. In an embodiment, the pixel defining layer 115 may include or may be formed of a material such as photoresist, polyimide resin, acrylic resin, a silicone compound, or polyacrylic resin.

The organic light emitting layer 122 is disposed on the first electrode 121 exposed by the pixel defining layer 115. The organic light emitting layer 122 may be a color light emitting layer which emits light of a specific color. For example, the organic light emitting layer 122 may include a red light emitting layer 1221 which emits red light, a green light emitting layer 122_2 which emits green light, and a blue light emitting layer 1223 which emits blue light. The color light emitting layer may be disposed in each pixel.

In some embodiments, the organic light emitting layer 122 may be formed as a single piece, unlike in FIG. 4. For example, the organic light emitting layer 122 may be formed as a single piece without distinction between the pixels. The organic light emitting layer 122 may be composed of a color light emitting layer which emits light of one color. For example, the organic light emitting layer 122 may be a blue light emitting layer which emits blue light. In this case, wavelength conversion patterns may be further disposed on the organic light emitting layer 122 to convert the color of light emitted from the organic light emitting layer 122.

The second electrode 123 is disposed on the organic light emitting layer 122. The second electrode 123 may be a common electrode disposed in common to (i.e., shared with) all pixels without distinction between the pixels. The second electrode 123 may be a cathode of the organic light emitting diode.

The second electrode 123 may include or may be formed of a material having a low work function. The second electrode 123 may include Li, Ca, LiF/Ca, LiF/Al, Al, Mg, Ag, Pt, Pd, Ni, Au Nd, Ir, Cr, BaF, Ba, or a compound or mixture of the same (e.g., a mixture of Ag and Mg or an alloy of Ag and Mg). The second electrode 123 may further include an auxiliary electrode. The auxiliary electrode may include a layer formed by deposition of one of the above materials and a transparent metal oxide, such as indium tin oxide (ITO), indium zinc oxide (IZO), zinc oxide (ZnO) or indium tin zinc oxide, on the above layer.

When the display device 1 is of a top emission type, a thin conductive layer having a small work function may be formed as the second electrode 123, and a transparent conductive layer such as an indium tin oxide (ITO) layer, an indium zinc oxide (IZO) layer, a zinc oxide (ZnO) layer or an indium oxide (In2O3) layer may be stacked on the conductive layer.

As described above, the first electrode 121, the organic light emitting layer 122, and the second electrode 123 may constitute a light emitting element.

Although not illustrated, a hole injection layer and/or a hole transport layer may be disposed between the first electrode 121 and the organic light emitting layer 122, and an electron transport layer and/or an electron injection layer may be disposed between the organic light emitting layer 122 and the second electrode 123.

The encapsulation layer 116 is disposed on the second electrode 123. The encapsulation layer 116 includes at least one inorganic layer and at least one organic layer. The at least one inorganic layer and the at least one organic layer may be stacked on each other. For example, as illustrated in FIG. 6, the encapsulation layer 116 may be a multilayer including a first encapsulating inorganic layer 116a, an encapsulating organic layer 116b, and a second encapsulating inorganic layer 116c stacked on each other sequentially. The first encapsulating inorganic layer 116a and the second encapsulating inorganic layer 116c may include or may be formed of one or more of silicon oxide (SiOx), silicon nitride (SiNx) and silicon oxynitride (SiONx), and the encapsulating organic layer 116b may include or may be formed of one of epoxy, acrylate, and urethane acrylate.

The touch member 30 is disposed on the encapsulation layer 116. The touch member 30 may contact an upper surface of the second encapsulating inorganic layer 116c of the encapsulation layer 116.

Sensing electrodes and bridge connection electrodes connecting the sensing electrodes may be disposed in the active area AAR of the touch member 30, and a plurality of signal lines connected to the sensing electrodes may be disposed in the non-active area NAR of the touch member 30.

The touch member 30 may include a first touch insulating layer 310, a first touch conductive layer YMTL1 disposed on the first touch insulating layer 310, a second touch insulating layer 330 disposed on the first touch conductive layer YMTL1, a second touch conductive layer YMTL2 disposed on the second touch insulating layer 330, a third touch conductive layer YMTL3 disposed on the second touch conductive layer YMTL2, and a third touch insulating layer 350 disposed on the third touch conductive layer YMTL3.

The first touch insulating layer 310 may be disposed on the second encapsulating inorganic layer 116c. The first touch insulating layer 310 may be formed or may be directly formed on the second encapsulating inorganic layer 116c. In some embodiments, the first touch insulating layer 310 may contact the second encapsulating inorganic layer 116c. The first touch insulating layer 310 may insulate the first touch conductive layer YMTL1 from a plurality of conductive layers of the display member 20. The first touch insulating layer 310 may also be disposed in the pad area PA.

The first touch insulating layer 310 may include or may be formed of an inorganic insulating material in an embodiment. The inorganic material may include or may be formed of one or more of silicon oxide (SiOx), silicon nitride (SiNx), and silicon oxynitride (SiONx). In an embodiment, the first touch insulating layer 310 may include or may be formed of an organic material. The organic material may include at least one of acrylic resin, methacrylic resin, polyisoprene, vinyl resin, epoxy resin, urethane resin, cellulose resin, siloxane resin, polyimide resin, polyamide resin, and perylene resin.

The first touch conductive layer YMTL1 may be disposed on the first touch insulating layer 310. The first touch conductive layer YMTL1 may include second touch bridge electrodes CP2 electrically connecting adjacent second sensing electrodes IE2_1 through IE2_4. For example, second sensing electrodes IE2_1 may be arranged in the first direction DR1, and each second touch bridge electrode CP2 may electrically connect two corresponding adjacent second sensing electrodes with each other. This arrangements of the second sensing electrodes IE2_1 may apply to the other second sensing electrodes IE2_2 to IE2_4. The second touch bridge electrodes CP2 may be spaced apart from each other. The second touch bridge electrodes CP2 spaced apart from each other may partially expose an upper surface of the first touch insulating layer 310. The second touch bridge electrodes CP2 of the first touch conductive layer YMTL1 may overlap a black matrix and the pixel defining layer 115. Therefore, the black matrix and the pixel defining layer 115 may be prevented from being seen by a user.

The touch member 30 may include a plurality of first sensing electrodes IE1_1 through IE1_8, a plurality of second sensing electrodes IE2_1 through IE2_4, first touch bridge electrodes CP1 electrically connecting adjacent first sensing electrodes IE1_1 through IE1_8, the second touch bridge electrodes CP2 described above, and touch pads PAD disposed in the pad area PA.

The first sensing electrodes IE1_1 through IE1_8 may extend along the second direction DR2 and may be arranged along the first direction DR1. The second sensing electrodes IE2_1 through IE2_4 may extend along the first direction DR1 and may be arranged along the second direction DR2.

Each of the first sensing electrodes IE1_1 through IE1_8 may include a plurality of first sensing lines SPL1 disposed in a mesh shape. An area defined by the first sensing lines SPL1 may overlap the organic light emitting layer 122_1, 122_2 or 122_3 disposed in each pixel.

Each of the second sensing electrodes IE2_1 through IE2_4 may include a plurality of second sensing lines SPL2 disposed in a mesh shape. An area defined by the second sensing lines SPL2 may overlap the organic light emitting layer 122_1, 122_2 or 122_3. The area defined by the first sensing lines SPL1 and the area defined by the second sensing lines SPL2 may have a rhombus shape in an embodiment. The rhombus shape includes not only a substantially rhombus shape but also a shape close to a rhombus shape in consideration of a process and the arrangement of sensing lines.

The first sensing lines SPL1 are electrically insulated from the second sensing lines SPL2. In an embodiment, the first sensing lines SPL1 may be disposed on the same layer as the second sensing lines SPL2. The first touch bridge electrodes CP1 and the second touch bridge electrodes CP2 may be disposed on different layers from each other and thus electrically insulated from each other. In some embodiments, the first touch bridge electrodes CP1, the first sensing lines SPL1, and the second sensing lines SPL2 may be formed on the same layer (e.g., the second touch insulating layer 330) to be positioned at the same height, and the second touch bridge electrode CP2 may be formed on another layer (e.g., the first touch insulating layer 310). The second touch bridge electrode CP2 may be positioned below the first touch bridge electrodes CP1, the first sensing lines SPL1, and the second sensing lines SPL2. In some embodiments, the first touch bridge electrodes CP1, the first sensing lines SPL1, and the second sensing lines SPL2 may be formed or patterned from the same layer.

The touch bridge electrodes and the sensing electrodes as described above may overlap the black matrix and the pixel defining layer 115. Therefore, the black matrix and the pixel defining layer 115 may be prevented from being seen by a user.

The touch member 30 may further include second signal lines SL2 and third signal lines SL3 connected to the first sensing electrodes IE1_1 through IE1_8 and the second sensing electrodes IE2_1 through IE2_4 and passing through the pad area PA. The display member 20 may include first signal lines SL1 connected to the transistors TR of the active area AAR and passing through the pad area PA. The transistors TR may be connected to the pads PAD through the first signal lines SL1.

As illustrated in FIG. 5, in the touch member 30 according to an embodiment, the first sensing electrodes IE1_1 through IE1_4 may be connected to signal lines (not illustrated) (the third signal lines SL3) disposed on the right side in the drawing and thus connected to the pads PAD, the first sensing electrodes IE1_5 through IE1_8 may be connected to the third signal lines SL3 disposed on the left side in the drawing and thus connected to the pads PAD, and the second sensing electrodes IE2_1 through IE2_4 may be connected to the second signal lines SL2 disposed on a lower side in the drawing and thus connected to the pads PAD.

The second touch insulating layer 330 may be disposed on the first touch conductive layer YMTL1. The second touch insulating layer 330 may contact the exposed upper surface of the first touch insulating layer 310. The second touch insulating layer 330 may insulate the first touch conductive layer YMTL1 from the second touch conductive layer YMTL2. The second touch insulating layer 330 may include or may be formed of an organic insulating material. Examples of the organic insulating material may include polyacrylates resin, epoxy resin, phenolic resin, polyamides resin, polyimides resin, unsaturated polyesters resin, polyphenylenethers resin, polyphenylenesulfides resin, or benzocyclobutene (BCB).

The second touch insulating layer 330 including an organic insulating material may greatly reduce generation of parasitic capacitance between sensing lines SPL1a and SPL2a of the second touch conductive layer YMTL2 to be described later and the conductive layers DCL1 and DCL2 of the display member 20 (see FIG. 4).

In the pad area PA, the second touch insulating layer 330 may be disposed on the second pad electrode PE2. The second touch insulating layer 330 may partially expose an upper surface of the second pad electrode PE2. In the active area AAR, the second touch insulating layer 330 may expose upper surfaces of the second touch bridge electrodes CP2 and may include first contact holes CNT penetrating the second touch insulating layer 330 in the thickness direction. In the pad area PA, the first and second touch insulating layers 310 and 330 may include a second contact hole CNT'.

The second contact hole CNT' may penetrate the first and second touch insulating layers 310 and 330 in the thickness direction.

The second touch conductive layer YMTL2 may be disposed on the second touch insulating layer 330. In some embodiments, the second touch conductive layer YMTL2 may contact the second touch insulating layer 330. The second touch conductive layer YMTL2 may include a first lower sensing line SPL1a of each of the first sensing lines SPL1 overlapping the second touch bridge electrodes CP2, a second lower sensing line SPL2a spaced apart from the first lower sensing line SPL1a and connected to the second touch bridge electrode CP2 through the first contact holes CNT, and a third pad electrode PE3 connected to the second pad electrode PE2 through the second contact hole CNT'. A lower surface SPL1a_S2 of the first lower sensing line SPL1a may contact the second touch insulating layer 330.

The first touch conductive layer YMTL1 may include or may be formed of a conductive material. The conductive material may include a low-resistance metal such as silver (Ag), aluminum (Al), chromium (Cr) or nickel (Ni), or may include a conductive nano material such as silver nanowires or carbon nanotubes.

The third touch conductive layer YMTL3 may be disposed on the second touch conductive layer YMTL2. The third touch conductive layer YMTL3 may include a first upper sensing line SPL1b overlapping the first lower sensing line SPL1a, a second upper sensing line SPL2b overlapping the second lower sensing line SPL2a, and a fourth pad electrode PE4 overlapping the third pad electrode PE3 in the pad area PA. The first upper sensing line SPL1b may contact the first lower sensing line SPL1a, the second upper sensing line SPL2b may contact the second lower sensing line SPL2a, and the fourth pad electrode PE4 may contact the third pad electrode PE3. A lower surface SPL1b_S2 of the first upper sensing line SPL1b may contact an upper surface SPL1a_S1 of the first lower sensing line SPL1a.

The material of the third touch conductive layer YMTL3 may be different from the material of the second touch conductive layer YMTL2. For example, the material of the second touch conductive layer YMTL2 may include or may be formed of an opaque metal, and the material of the third touch conductive layer YMTL3 may include or may be formed of a transparent conductive material. For example, the material of the second touch conductive layer YMTL2 may include or may be formed of a low-resistance metal such as silver (Ag), aluminum (Al), chromium (Cr) or nickel (Ni), or may include a conductive nano material such as silver nanowires or carbon nanotubes, and the material of the third touch conductive layer YMTL3 may include or may be formed of a transparent conductive oxide (TCO). Examples of the transparent conductive oxide may include indium tin oxide (ITO) or indium zinc oxide (IZO).

When the sensing lines SPL1 and SPL2 are formed only of the second touch conductive layer YMTL2, a photoresist may be directly placed on the second touch conductive layer YMTL2 in an area excluding patterns corresponding to desired sensing lines SPL1 and SPL2 and then may be exposed and developed to form desired patterns of the sensing lines SPL1 and SPL2. After the patterns of the sensing lines SPL1 and SPL2 are formed, the photoresist formed directly on the second touch conductive layer YMTL2 may be removed through, for example, an ashing solution having an amine component. During the ashing process using the ashing solution, the ashing solution may permeate into the second touch insulating layer 330 located directly under the second touch conductive layer YMTL2.

Since the second touch insulating layer 330 includes or may be formed of an organic material, the permeated ashing solution may cause cracks inside the second touch insulating layer 330. For example, the ashing solution may cause cracks inside the second touch insulating layer 330, thereby generating a large number of voids in the internal crack space. Due to the voids, the second touch insulating layer 330 itself may expand upward. When the degree of expansion becomes excessive, the second touch insulating layer 330 may peel off from the first touch insulating layer 310 and the first touch conductive layer YMTL1 disposed directly under the second touch insulating layer 330.

However, in the display device 1 according to the current embodiment, the sensing lines SPL1 and SPL2 are formed using the second touch conductive layer YMTL2 and the third touch conductive layer YMTL3. In an ashing process on a photoresist used to form patterns of the third touch conductive layer YMTL3, the ashing solution may fail to permeate into the second touch insulating layer 330 due to the second touch conductive layer YMTL2. For example, the second touch conductive layer YMTL2, which has not yet been patterned into the lower sensing lines SPL1 and SPL2a, may prevent the ashing solution from permeating into the second touch insulating layer 330. Patterns (or the lower sensing lines SPL1a and SPL2a) of the second touch conductive layer YMTL2 may be formed using the upper sensing lines SPL1b and SPL2b, which are formed from the third touch conductive layer YMTL3, as a mask. For example, after the forming of the upper sensing lines SPL1b and SPL2b from the third conductive layer YMTL3, the lower sensing lines SPL1a and SPL2a may be patterned from the second touch conductive layer using the upper sensing lines SPL1b and SPL2b as a mask in an etching or ashing process.

A method of forming the third pad electrode PE3 and the fourth pad electrode PE4 is the same as the above-described method of forming the sensing lines SPL1 and SPL2 using the second and third touch conductive layers (YMTL2 and YMTL3), and thus a detailed description thereof will be omitted.

Due to the above process of manufacturing the sensing lines SPL1 and SPL2, a width of the first upper sensing line SPL1b may be greater than a width of the first lower sensing line SPL1a, a width of the second upper sensing line SPL2b may be greater than a width of the second lower sensing line SPL2a, and a width of the fourth pad electrode PE4 may be greater than a width of the third pad electrode PE3.

The first lower sensing line SPL1a may be located within an outer boundary of the first upper sensing line SPL1b in a plan view. The second lower sensing line SPL2a may be located within an outer boundary of the second upper sensing line SPL2a in a plan view. The third pad electrode PE3 may be located within an outer boundary of the fourth pad electrode PE4 in a plan view.

In a plan view, a second upper sensing line SPL2b may be closer to a side surface SPL1b_S3 of the first upper sensing line SPL1b adjacent to the second upper sensing line SPL2b than a side surface SPL1a_S3 of the first lower sensing line SPL1a adjacent thereto. In a plan view, another second sensing line SPL2b may be closer to the other side surface SPL1b_S3 of the first upper sensing line SPL1b, adjacent to another second sensing line SPL2b, than the other side surface SPL1a_S3 of the first lower sensing line SPL1a adjacent thereto. In a plan view, a first upper sensing line SPL1b may be closer to a side surface of the second upper sensing line SPL2b, adjacent to the first upper sensing line SPL1b, than a side surface of the second lower sensing line SPL2a adjacent thereto.

The third touch insulating layer 350 may be disposed on the third touch conductive layer YMTL3. The third touch insulating layer 350 may include or may be formed of at least one of the materials of the second touch insulating layer 330 described above. As illustrated in FIG. 7, the third touch insulating layer 350 may contact upper and side surfaces SPL1b_S1 and SPL1b_S3 of the first upper sensing line SPL1b, upper and side surfaces of the second upper sensing line SPL2b, side surfaces SPL1a_S3 of the first lower sensing line SPL1a, side surfaces of the second lower sensing line SPL2a, and an exposed upper surface of the second touch insulating layer 330. The third touch insulating layer 350 may partially expose an upper surface of the fourth pad electrode PE4 in the pad area PA.

A method of manufacturing a display device according to an embodiment will now be described. In the following embodiments, the same elements as those of the embodiment described above will be indicated by the same reference characters, and their description will be omitted or given briefly.

Figure 8:
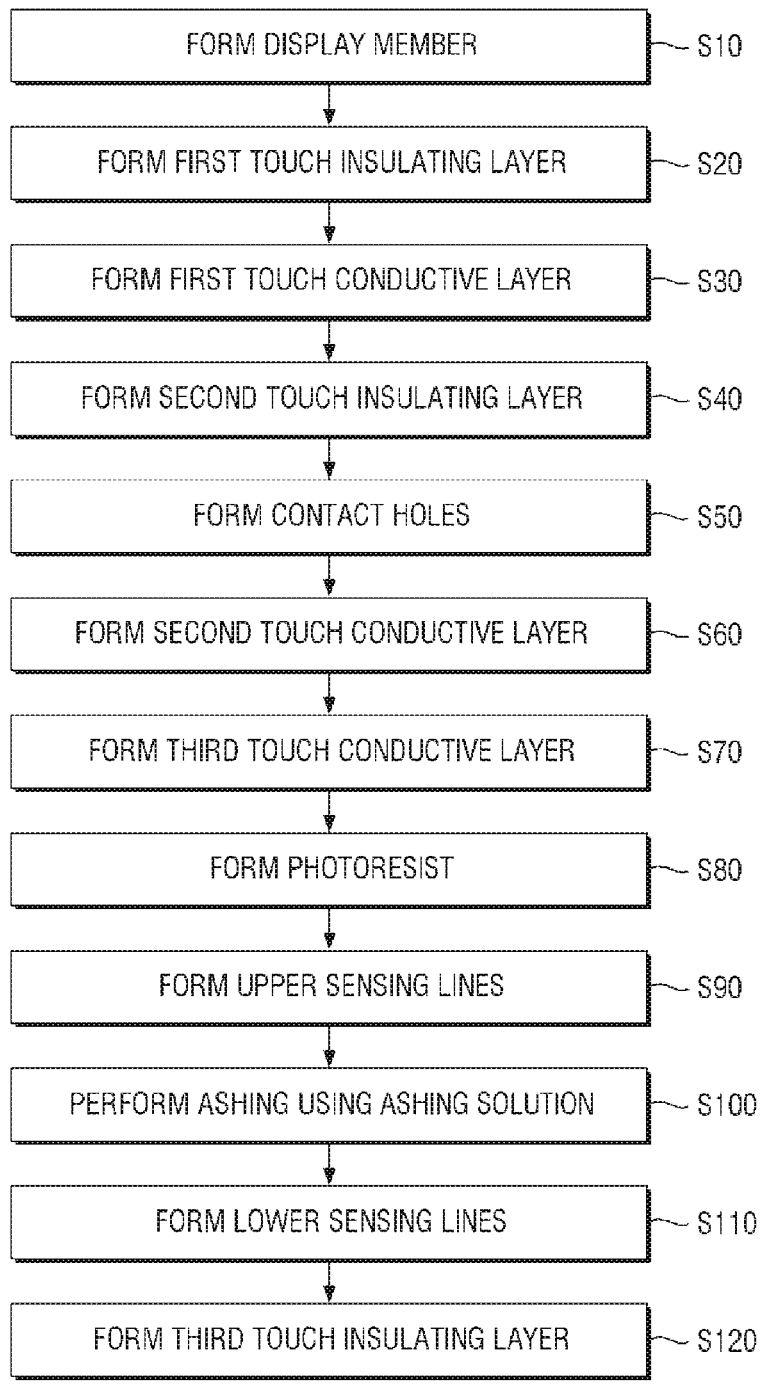
FIG. 8 is a flowchart illustrating a method of manufacturing a display device according to an embodiment of the present inventive concept.

FIG. 8 is a flowchart illustrating a method of manufacturing a display device according to an embodiment. FIGS. 9 through 16 are cross-sectional views illustrating operations in the method of manufacturing a display device according to the embodiment. When the method of manufacturing a display device according to the embodiment is described with reference to FIGS. 8 through 16, FIGS. 1 through 7 described above will also be referred to.

Figure 9:
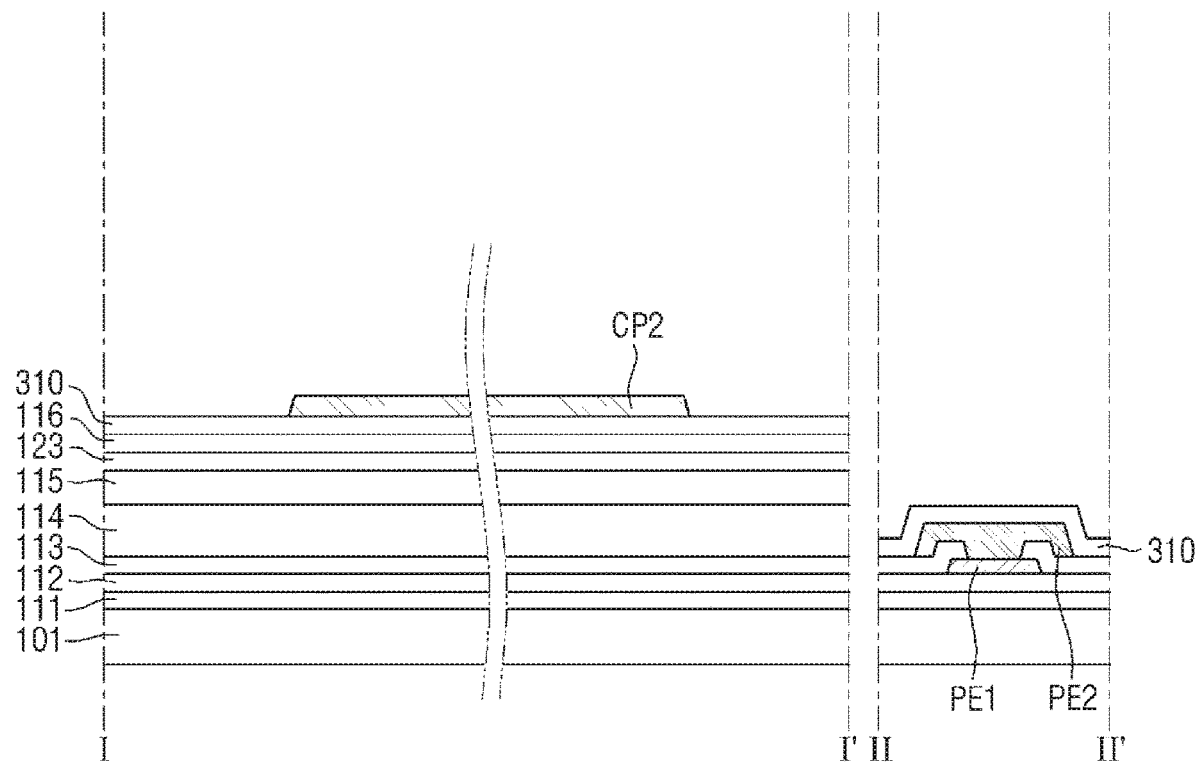
FIGS. 9 through 16 are cross-sectional views illustrating operations in the method of manufacturing a display device according to the embodiment of FIG. 8.

Referring to FIGS. 4, 8 and 9, a display member is formed by forming a gate insulating layer 112 on a substrate part 101 which includes an active area AAR and a non-active area NAR located around the active area AAR and including a pad area PA, forming a first conductive layer DCL1 which is disposed on the gate insulating layer 112 and includes a gate electrode GE of the active area AAR and a first pad electrode PE1 of the pad area PA, forming an interlayer insulating film 113 which is disposed on the first conductive layer DCL1, and forming a second conductive layer DCL2 which is disposed on the interlayer insulating film 113 and includes a drain electrode DE and a source electrode SE of the active area AAR and a second pad electrode PE2 of the pad area PA (operation S10).

Next, referring to FIGS. 4, 8 and 9, a first touch insulating layer 310 is formed on the second conductive layer DCL2 in the active area AAR and the pad area PA (operation S20).

Next, a first touch conductive layer including a second touch bridge electrode CP2 is formed on the first touch insulating layer 310 in the active area AAR (operation S30).

Figure 10:
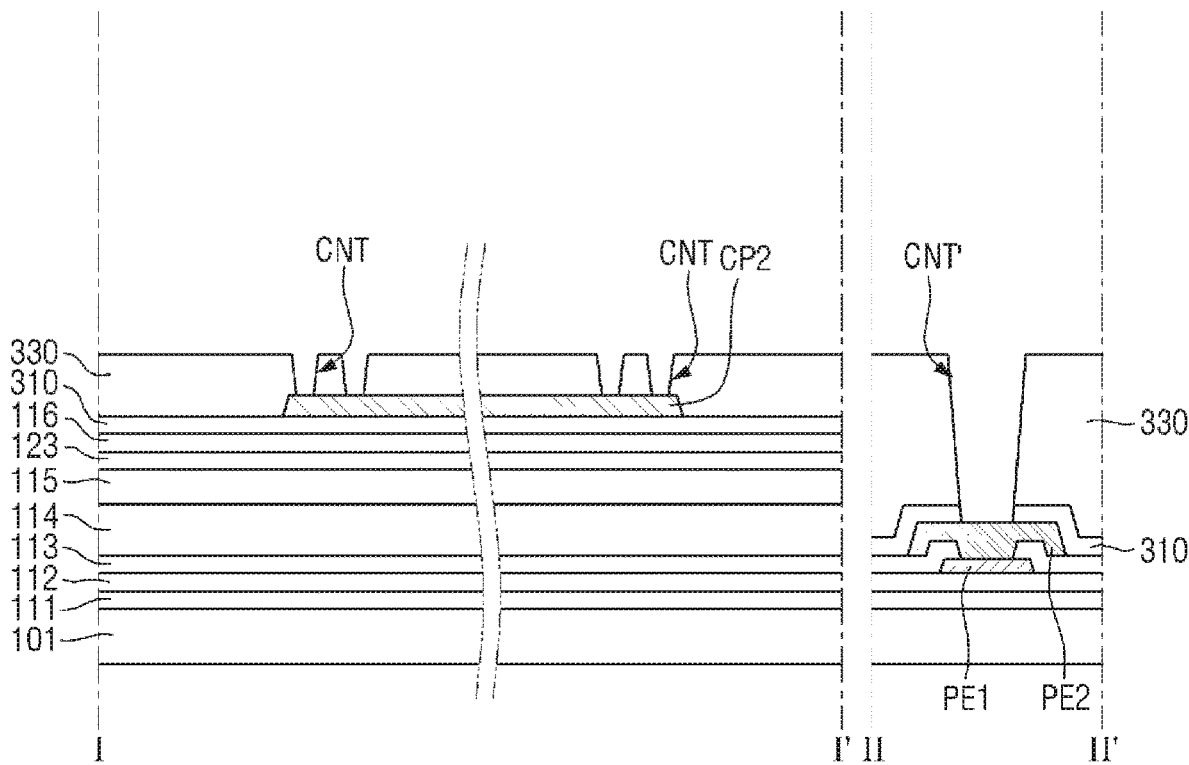

Next, referring to FIGS. 4, 8 and 10, a second touch insulating layer 330 made of an organic material is formed on the first touch conductive layer in the active area AAR and the pad area PA (operation S40).

Examples of the organic insulating material may include polyacrylates resin, epoxy resin, phenolic resin, polyamides resin, polyimides resin, unsaturated polyesters resin, polyphenylenethers resin, polyphenylenesulfides resin, or benzocyclobutene (BCB).

Next, first contact holes CNT exposing an upper surface of the second touch bridge electrode CP2 and a second contact hole CNT' exposing an upper surface of the second pad electrode PE2 are formed (operation S50).

Figure 11:
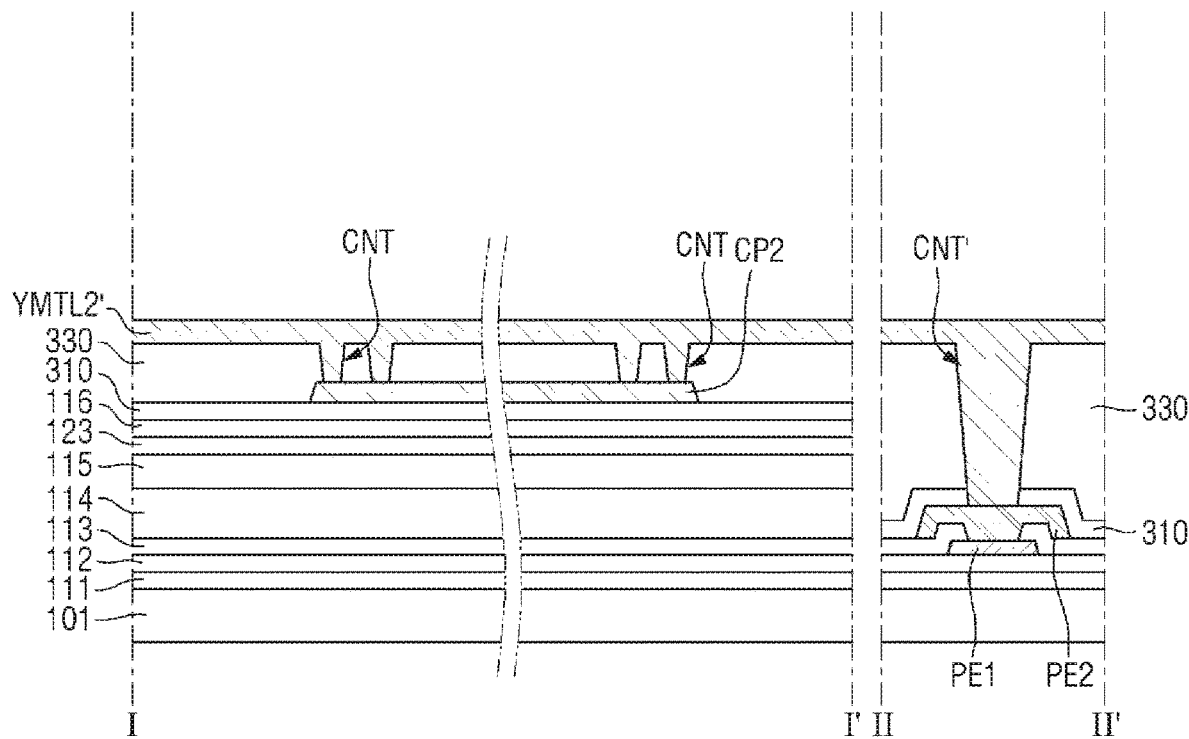

Next, referring to FIGS. 4, 8 and 11, a second touch conductive layer YMTL2' is formed on the second touch insulating layer 330 (operation S60). The second touch conductive layer YMTL2' may fill the contact holes CNT and CNT'.

Figure 12:
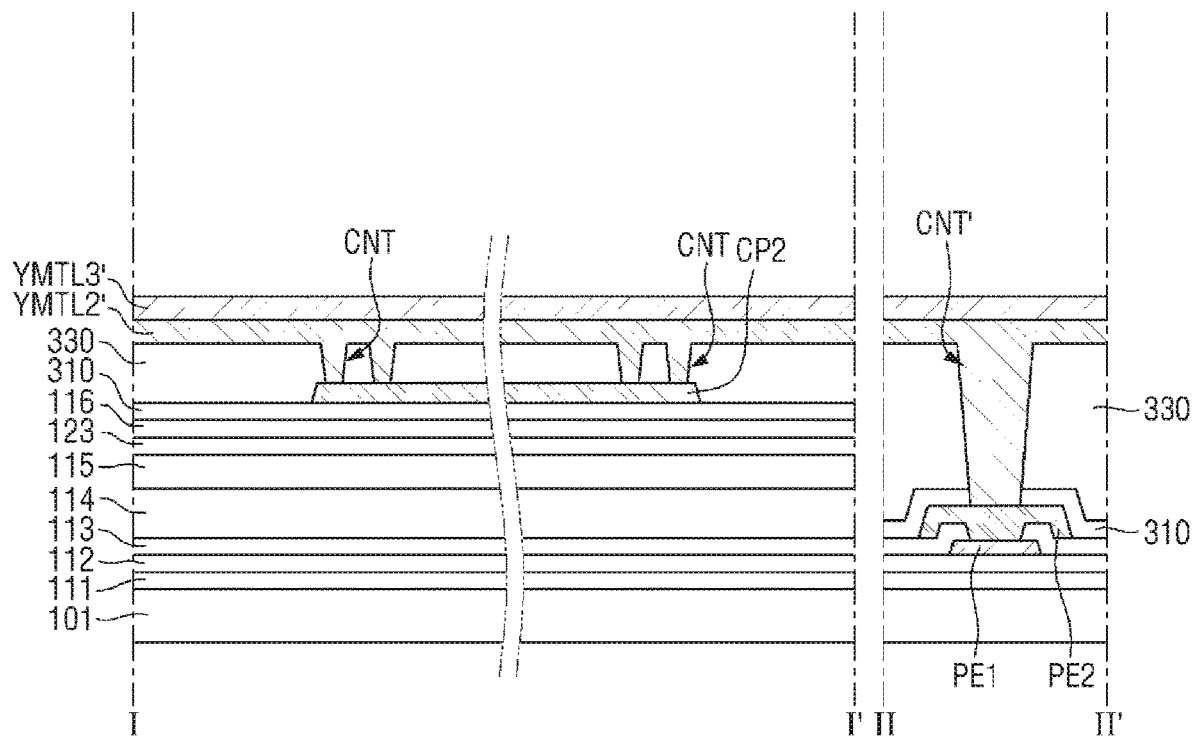

Next, referring to FIGS. 4, 8 and 12, a third touch conductive layer YMTL3' is formed on the second touch conductive layer YMTL2' (operation S70).

Figure 13:
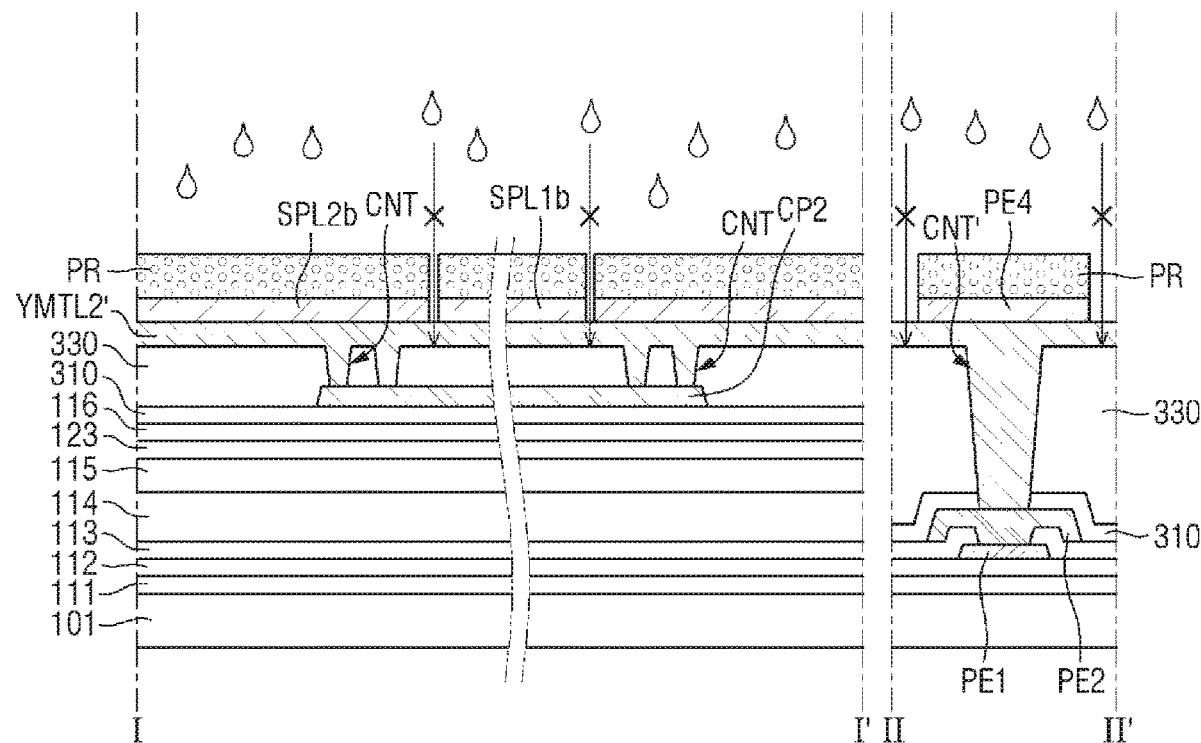

Next, referring to FIGS. 4, 8 and 13, a photoresist PR is formed on the third touch conductive layer YMTL3' (operation S80).

Next, by using the photoresist PR, a first upper sensing line SPL1b and a second upper sensing line SPL2b of the third touch conductive layer YMTL3 are formed at a distance from each other in the active area AAR, and a fourth pad electrode PE4 of the third touch conductive layer YMTL3 is formed in the pad area PA (operation S90). For example, the first upper sensing line SPL1b and the second upper sensing line SPL2b may be spaced apart from each other at a first distance.

Figure 14:
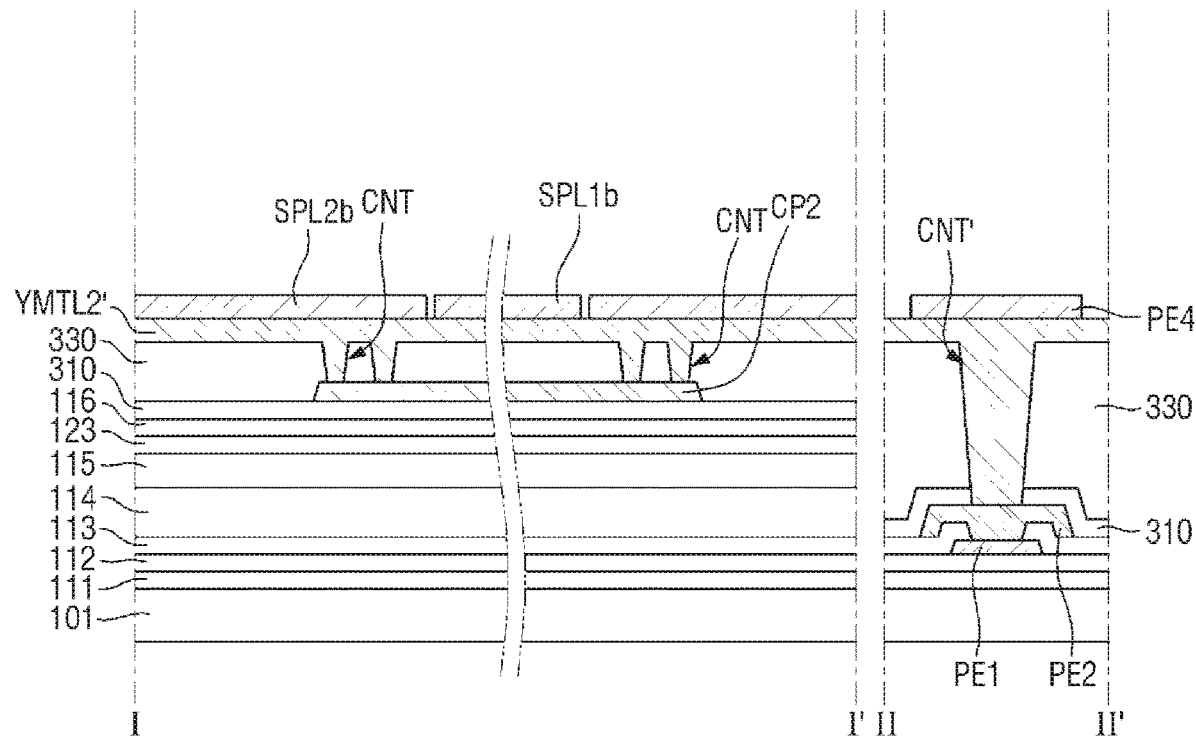

Next, an ashing operation is performed using an ashing solution to remove the photoresist PR (operation S100). A cross-sectional shape from which the photoresist PR has been removed is illustrated in FIG. 14. In the performing of the ashing operation on the photoresist PR (operation S100), the ashing solution may not permeate into the second touch insulating layer 330 due to the second touch conductive layer YMTL2'. For example, the second touch conductive layer YMTL2' may prevent the ashing solution from permeating into the second touch insulating layer 330.

Figure 15:
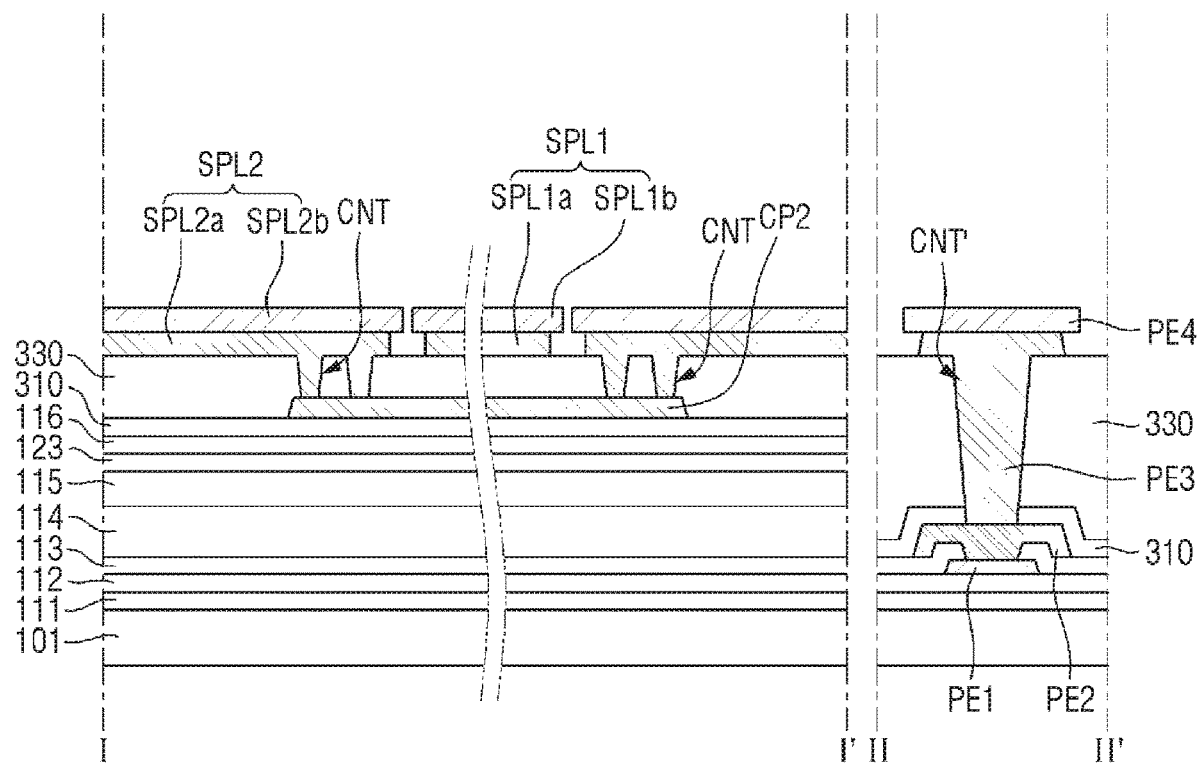

Next, referring to FIGS. 4, 8 and 15, a first lower sensing line SPL1a and a second lower sensing line SPL2a of the second touch conductive layer YMTL2 are formed at a distance from each other in the active area AAR, and a third pad electrode PE3 is formed in the pad area PA by using the first upper sensing line SPL1b, the second upper sensing line SPL2b, and the fourth pad electrode PE4 (operation S110). For example, the first lower sensing line SPL1a and the second lower sensing line SPL2a may be spaced apart from each other at a second distance. In some embodiments, the second distance may be greater than the first distance between the first upper sensing line SPL1b and the second upper sensing line SPL2b.

Figure 16:
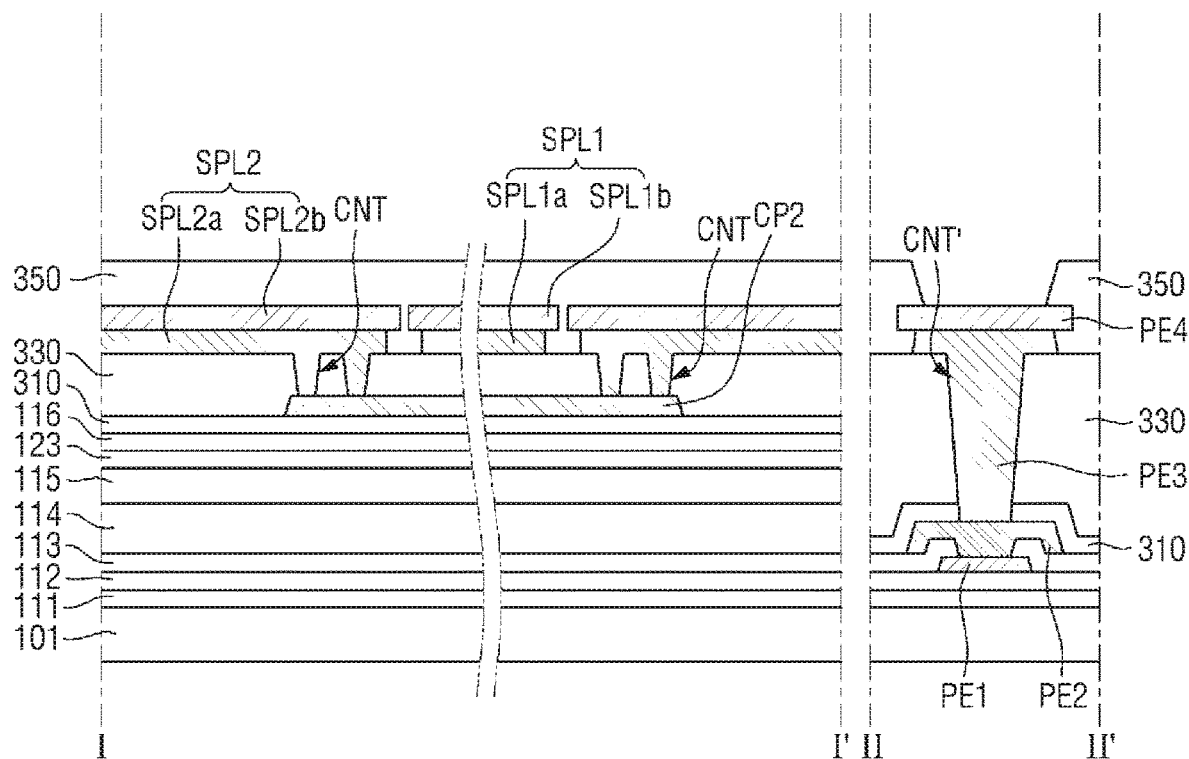

Next, referring to FIGS. 4, 8 and 16, a third touch insulating layer 350 is formed on the first upper sensing line SPL1b, the second upper sensing line SPL2b, and the fourth pad electrode PE4 (operation S120). The third touch insulating layer 350 may partially expose an upper surface of the fourth pad electrode PE4 in the pad area PA.

Figure 17:
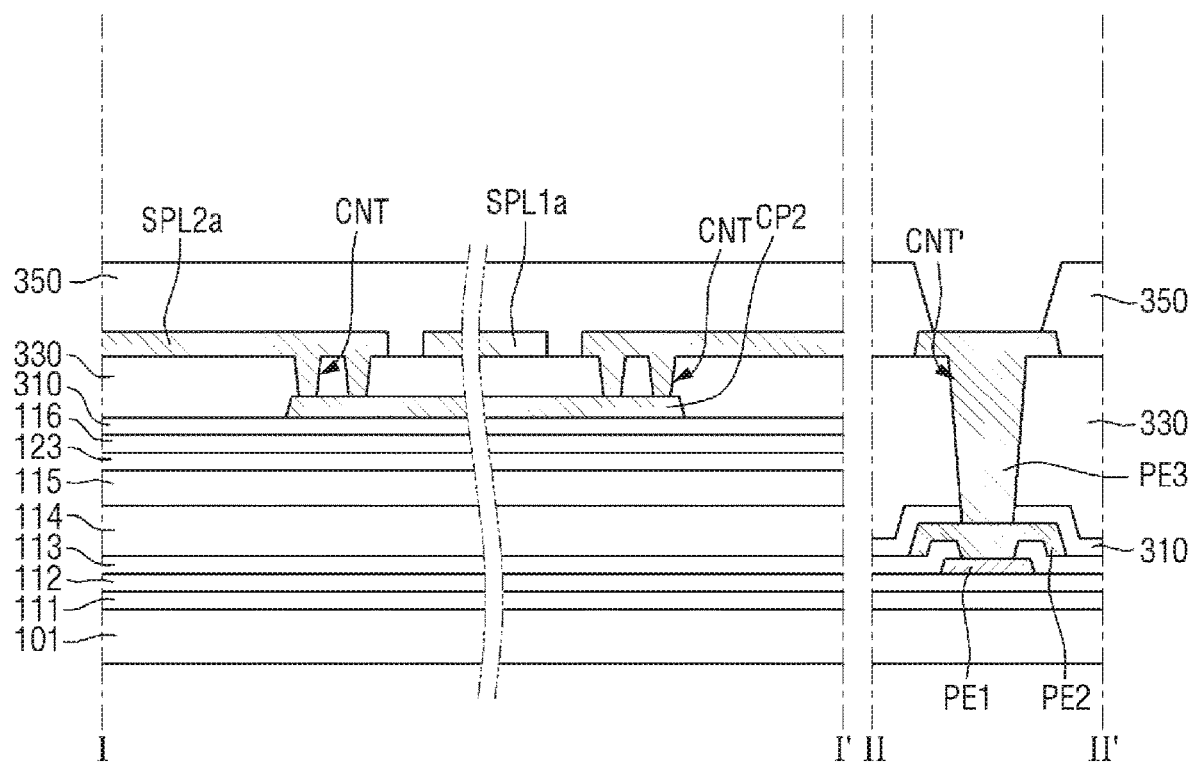
FIG. 17 is a cross-sectional view of a display device according to an embodiment of the present inventive concept.
Figure 18:
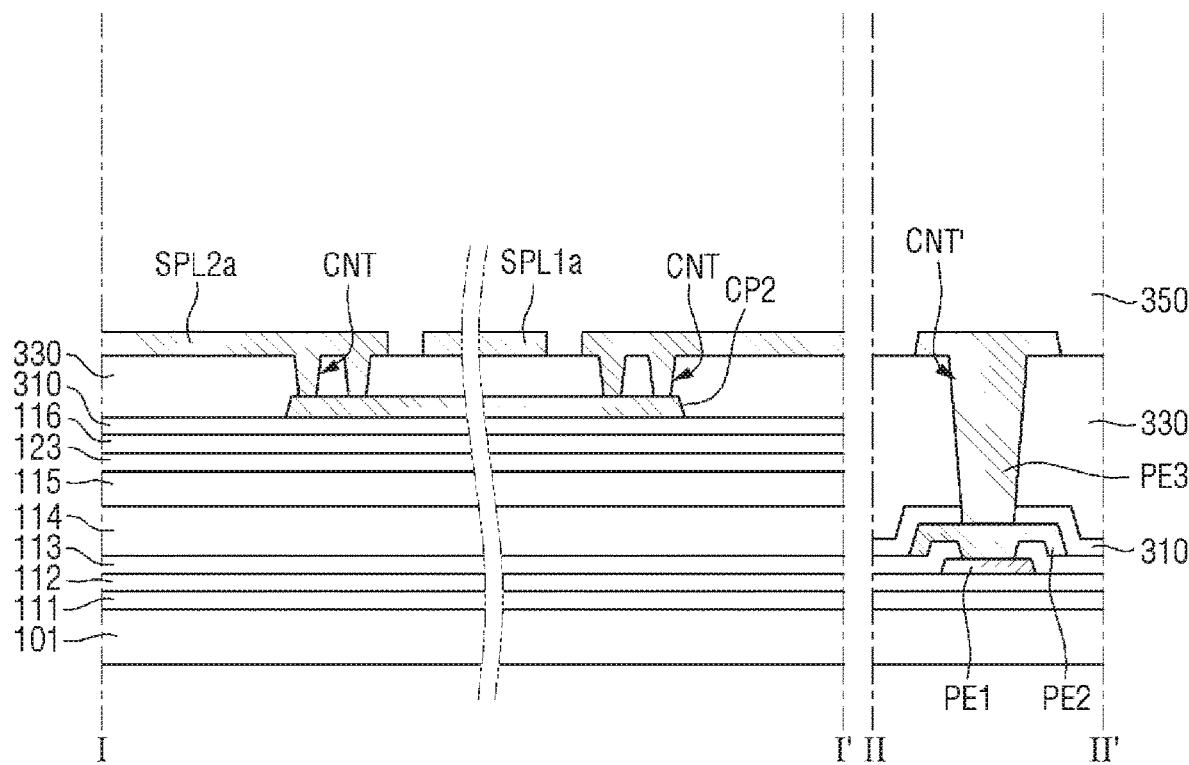
FIGS. 18 and 19 are cross-sectional views illustrating operations in a method of manufacturing the display device of FIG. 17 according to an embodiment of the present inventive concept.
Figure 19:
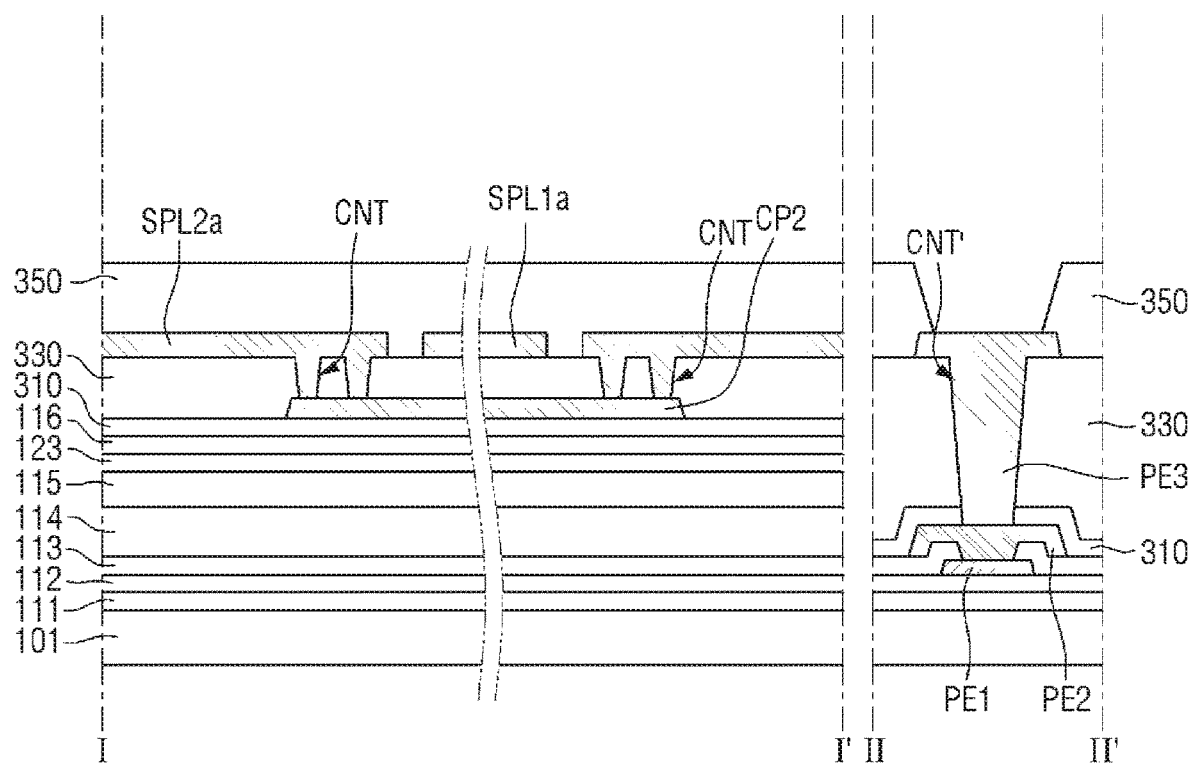

FIG. 17 is a cross-sectional view of a display device according to an embodiment. FIGS. 18 and 19 are cross-sectional views illustrating operations in a method of manufacturing the display device of FIG. 17.

Referring to FIGS. 17 through 20, the display device according to an embodiment is different from the display device of FIG. 7 in that it does not include a third touch conductive layer YMTL3.

The method of manufacturing the display device of FIG. 17 will be described. The method of manufacturing the display device of FIG. 17 is the same as the method of manufacturing the display device of FIG. 7 and FIGS. 9 through 15 and is different from FIGS. 16 and 17.

Referring to FIGS. 4, 8 and 18, in the cross-sectional shape of the display device of FIG. 15, a first upper sensing line SPL1b, a second upper sensing line SPL2b, and a fourth pad electrode PE4 may be etched, and a third touch insulating layer 350 may be formed on a first lower sensing line SPL1a, a second lower sensing line SPL2a, and a third pad electrode PE3.

Figure 20:
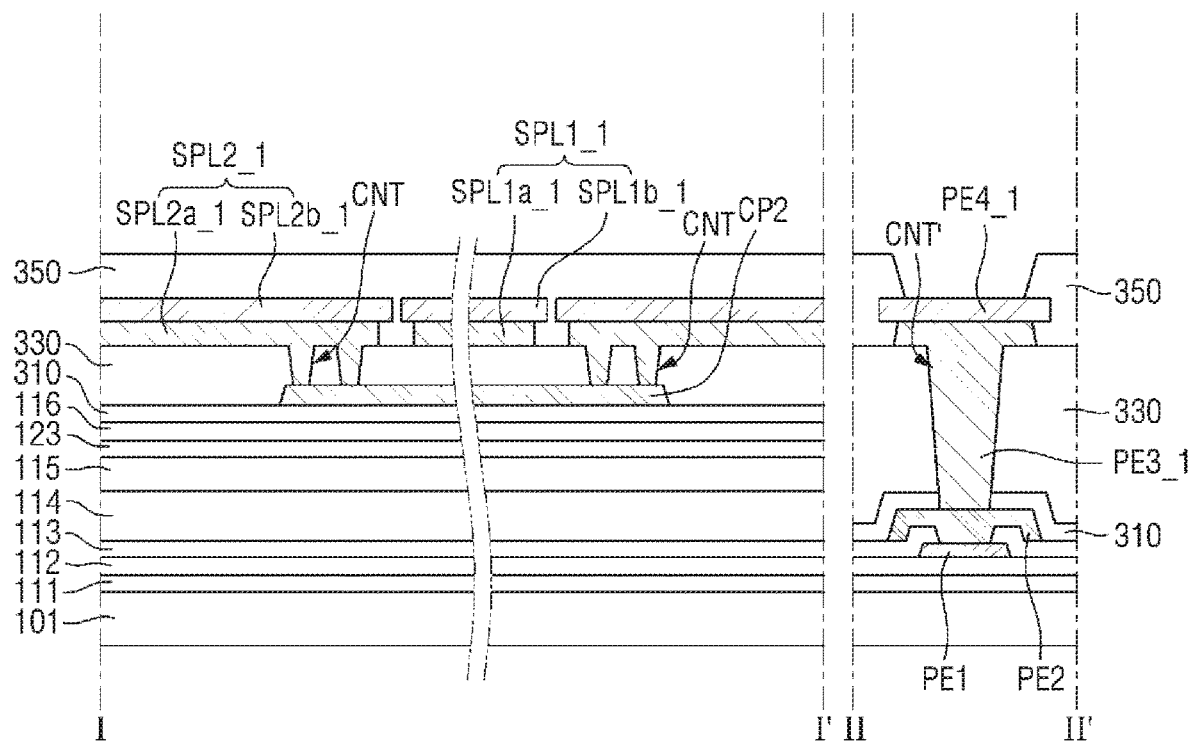
FIG. 20 is a cross-sectional view of a display device according to an embodiment of the present inventive concept.

FIG. 20 is a cross-sectional view of a display device according to an embodiment.

Referring to FIG. 20, the material of a second touch conductive layer YMTL2_1 of the display device according to the current embodiment is the same as the material of the third touch conductive layer YMTL3 described above in FIG. 7, and the material of a third touch conductive layer YMTL3_1 is the same as the material of the second touch conductive layer YMTL2 described above in FIG. 7.

Other descriptions are the same as those of FIG. 7 and thus will be omitted.

In a display device and a method of manufacturing the same according to an embodiment, touch characteristics of a touch member of the display device can be improved, and defects of a second touch insulating layer of the touch member can be improved.

However, the effects of the present disclosure are not restricted to the one set forth herein. The above and other effects of the present disclosure will become more apparent to one of daily skill in the art to which the present disclosure pertains by referencing the claims.

What is claimed is:

1. A display device comprising:
   a display member; and
   a touch member which is disposed on the display member,
   wherein the touch member comprises:
      a first touch insulating layer which is disposed on the display member;
      a first touch conductive layer which is disposed on the first touch insulating layer and comprises a touch bridge electrode;
      a second touch insulating layer which is disposed on the first touch conductive layer, comprises an organic material, and comprises a first contact hole penetrating the second touch insulating layer in a thickness direction;
      a second touch conductive layer which is disposed on the second touch insulating layer and comprises a first lower sensing line overlapping the touch bridge electrode; and
      a third touch conductive layer which is disposed on the second touch conductive layer and comprises a first upper sensing line overlapping the first lower sensing line,
   wherein a width of the first upper sensing line is greater than a width of the first lower sensing line.

2. The display device of claim 1,
   wherein the first lower sensing line is located within an outer boundary of the first upper sensing line in a plan view.

3. The display device of claim 2,
   wherein the first upper sensing line directly contacts the first lower sensing line.

4. The display device of claim 3,
   wherein the second touch conductive layer further comprises:
   a second lower sensing line which is spaced apart from the first lower sensing line and is connected to the touch bridge electrode through the first contact hole, and
   wherein the third touch conductive layer further comprises:
   a second upper sensing line which overlaps the second lower sensing line and is spaced apart from the first upper sensing line.

5. The display device of claim 4,
wherein the second upper sensing line is adjacent to the first upper sensing line and the first lower sensing line, and
wherein the second upper sensing line is closer to a side surface of the first upper sensing line than a side surface of the first lower sensing line in a plan view.

6. The display device of claim 5,
wherein the second touch conductive layer further comprises:
a third lower sensing line which is spaced apart from the first lower sensing line and is electrically connected to the second lower sensing line via the touch bridge electrode,
wherein the first lower sensing line is disposed between the second lower sensing line and the third lower sensing line,
wherein the third touch conductive layer further comprises:
a third upper sensing line which overlaps the third lower sensing line and is spaced apart from the first upper sensing line,
wherein the first upper sensing line is disposed between the second upper sensing line and the third upper sensing line,
wherein the third upper sensing line is closer to the other side surface of the first upper sensing line than the other side surface of the first lower sensing line in the plan view.

7. The display device of claim 6,
wherein the first upper sensing line is closer to a side surface of the second upper sensing line than a side surface of the second lower sensing line in the plan view.

8. The display device of claim 1, wherein the display member comprises:
a substrate with an active area and a non-active area,
wherein the non-active area is located around the active area and includes a pad area;
a first insulating layer which is disposed on the substrate;
a first conductive layer which is disposed on the first insulating layer and comprises a gate electrode of the active area and a first pad electrode of the pad area;
a second insulating layer which is disposed on the first conductive layer; and
a second conductive layer which is disposed on the second insulating layer and comprises a drain electrode and a source electrode of the active area and a second pad electrode of the pad area,
wherein the second pad electrode overlaps the first pad electrode.

9. The display device of claim 8,
wherein each of the first touch insulating layer and the second touch insulating layer is further disposed in the pad area and comprises a second contact hole which partially exposes an upper surface of the second pad electrode in the pad area.

10. The display device of claim 9,
wherein the second touch conductive layer further comprises a third pad electrode which is connected to the second pad electrode through the second contact hole in the pad area.

11. The display device of claim 10,
wherein the third touch conductive layer further comprises a fourth pad electrode which overlaps the third pad electrode in the pad area.

12. The display device of claim 11,
wherein the touch member further comprises:
a third touch insulating layer which is disposed on the third touch conductive layer,
wherein the third touch insulating layer partially exposes an upper surface of the fourth pad electrode in the pad area.

13. The display device of claim 1,
wherein a material of the second touch conductive layer and a material of the third touch conductive layer are different from each other.

14. The display device of claim 13,
wherein the material of the second touch conductive layer comprises an opaque metal, and the material of the third touch conductive layer comprises a transparent conductive material.

* * * * *